(12) United States Patent
Fujii et al.

(10) Patent No.: US 8,829,627 B2
(45) Date of Patent: Sep. 9, 2014

(54) DYNAMIC QUANTITY SENSOR DEVICE AND MANUFACTURING METHOD OF THE SAME

(75) Inventors: Tetsuo Fujii, Toyohashi (JP); Keisuke Gotoh, Toyohashi (JP); Kenichi Ao, Tokai (JP)

(73) Assignee: DENSO CORPORATION, Kariya (JP)

( * ) Notice: Subject to any disclaimer, the term of this patent is extended or adjusted under 35 U.S.C. 154(b) by 176 days.

(21) Appl. No.: 13/479,393

(22) Filed: May 24, 2012

(65) Prior Publication Data

US 2012/0299127 A1 Nov. 29, 2012

(30) Foreign Application Priority Data

May 27, 2011 (JP) ................................ 2011-119438
Mar. 23, 2012 (JP) ................................ 2012-067706

(51) Int. Cl.
| | | |
|---|---|---|
| H01L 29/84 | (2006.01) | |
| G01P 1/02 | (2006.01) | |
| B60C 23/04 | (2006.01) | |
| G01L 9/00 | (2006.01) | |
| G01P 15/08 | (2006.01) | |
| G01L 19/00 | (2006.01) | |
| B81B 7/02 | (2006.01) | |
| G01P 15/125 | (2006.01) | |

(52) U.S. Cl.
CPC .............. *G01L 9/0073* (2013.01); *G01P 1/023* (2013.01); *B60C 23/0488* (2013.01); *G01P 15/08* (2013.01); *G01L 19/0092* (2013.01); *G01L 9/0085* (2013.01); *B81B 2201/025* (2013.01); *B81B 7/02* (2013.01); *G01P 15/125* (2013.01); *B81B 2207/015* (2013.01)
USPC .................. 257/415; 257/254; 257/E23.123; 438/50; 438/52; 438/53

(58) Field of Classification Search
USPC ......... 257/252, 254, 414, 415, 416, 417, 418, 257/419, 678, 723, 724, 725, E23.116, 257/E23.123; 438/48, 50, 51, 52, 53
See application file for complete search history.

(56) References Cited

U.S. PATENT DOCUMENTS 6,462,566 B1 10/2002 Schoefthaler et al.
7,223,624 B2 * 5/2007 Wu et al. ......................... 438/52
(Continued)

FOREIGN PATENT DOCUMENTS

JP 10-68643 A 3/1998
JP A-2006-010411 1/2006
(Continued)

OTHER PUBLICATIONS

Office Action mailed Jun. 11, 2013 in corresponding JP patent application No. 2012-067706 (and English translation).
(Continued)

*Primary Examiner* — Eduardo A Rodela
(74) *Attorney, Agent, or Firm* — Posz Law Group, PLC

(57) ABSTRACT

A dynamic quantity sensor device includes: first and second dynamic quantity sensors having first and second dynamic quantity detecting units; and first and second substrates, which are bonded to each other to provide first and second spaces. The first and second units are air-tightly accommodated in the first and second spaces, respectively. A SOI layer of the first substrate is divided into multiple semiconductor regions by trenches. First and second parts of the semiconductor regions provide the first and second units, respectively. The second part includes: a second movable semiconductor region having a second movable electrode, which is provided by a sacrifice etching of the embedded oxide film; and a second fixed semiconductor region having a second fixed electrode. The second sensor detects the second dynamic quantity by measuring a capacitance between the second movable and fixed electrodes, which is changeable in accordance with the second dynamic quantity.

20 Claims, 15 Drawing Sheets

(56) References Cited

U.S. PATENT DOCUMENTS

| | | |
|---|---|---|
| 7,449,355 B2 | 11/2008 | Lutz et al. |
| 7,534,658 B2 | 5/2009 | Amiotti |
| 7,625,773 B2 | 12/2009 | Lutz et al. |
| 8,569,092 B2 * | 10/2013 | Mantravadi et al. ............ 438/52 |
| 2002/0051258 A1 | 5/2002 | Tamura |
| 2008/0290490 A1 | 11/2008 | Fujii et al. |
| 2009/0261430 A1 * | 10/2009 | Suzuki et al. ................ 257/417 |
| 2010/0083755 A1 | 4/2010 | Morii |
| 2010/0176466 A1 | 7/2010 | Fujii et al. |
| 2011/0248363 A1 | 10/2011 | Fujii et al. |

FOREIGN PATENT DOCUMENTS

| | | |
|---|---|---|
| JP | 2007-259439 A | 10/2007 |
| JP | 2010-107325 A | 5/2010 |
| JP | A-2010-224693 | 10/2010 |
| JP | A-2012-078239 | 4/2012 |

OTHER PUBLICATIONS

"Dempa Shinbun Sensor Technology," *Dempa Shinbun*, Dempa Publications, Inc., May 13, 2004, p. 26 (Discussed on pp. 1-2 in the specification—English abstract attached).

* cited by examiner

DYNAMIC QUANTITY SENSOR DEVICE AND MANUFACTURING METHOD OF THE SAME

CROSS REFERENCE TO RELATED APPLICATIONS

This application is based on Japanese Patent Applications No. 2011-119438 filed on May 27, 2011, and No. 2012-67706 filed on Mar. 23, 2012, the disclosures of which are incorporated herein by reference.

TECHNICAL FIELD

The present disclosure relates to a dynamic quantity sensor device in which a pressure sensor and other dynamic quantity sensors are integrated as a module, and a method of manufacturing the same.

BACKGROUND

A technique is disclosed in "Dempa Shinbun Hi-Technology" May 13, 2004 (Non-Patent Document 1) as an example of a technique of integrating a pressure sensor and other dynamic quantity sensors as a module.

FIG. 20 is a diagram illustrating the cross-sectional structure of a sensor die in which a pressure sensor and an acceleration sensor are integrated, as disclosed in Non-Patent Document 1.

The technique disclosed in Non-Patent Document 1 relates to a tire air pressure sensor. In the sensor die illustrated in FIG. 20, a pressure sensor having a function of detecting a tire air pressure and an acceleration sensor having a function of detecting acceleration are integrated into one sensor die. The pressure sensor of FIG. 20 includes a diaphragm Dp that separates a vacuum-sealed space (reference pressure chamber) Kp and air inside a tire, and a piezoelectric resistor element for detecting a deformation of the diaphragm Dp by the tire air pressure is formed on a surface of the diaphragm Dp close to the reference pressure chamber Kp. The acceleration sensor of FIG. 20 is formed in the vacuum-sealed, space Ka different from the reference pressure chamber Kp of the pressure sensor. A force in a radial direction generated in a rotating wheel is detected based on a deformation of a cantilever La, and a wheel module determines whether the wheel rotates or not and the rotation speed thereof.

In the module structure of the pressure sensor and the acceleration sensor illustrated in FIG. 20, since the pressure sensor and the acceleration sensor are formed in the vacuum-sealed spaces Kp and Ka, both sensors can be protected from a lot of chemical substances (residual substances after tire hardening treatment, soap, water, or the like) present inside the tire.

Non-Patent Document 1: "Dempa Shinbun Hi-Technology," May 13, 2004, Dempa Publications, Inc.

In order to stably control the travelling of a vehicle, high-accuracy dynamic quantity sensors such as a gyro sensor (angular velocity sensor) for detecting an advancing direction of a vehicle as well as a tire air pressure and a rotation speed of a wheel and an acceleration sensor for detecting acceleration in the advancing direction are required. Moreover, since the altitude of the position of a vehicle also changes in accordance with the travelling, a high-sensitivity pressure sensor for detecting a change of atmospheric pressure in accordance with a change of altitude is required. Thus, in recent years, there has been a demand for a compact and inexpensive dynamic quantity sensor device in which a pressure sensor and high-accuracy dynamic quantity sensors such as an acceleration sensor and a gyrosensor are integrated as modules.

In relation to the above demand, the module structure disclosed in Non-Patent Document 1 illustrated in FIG. 20 is configured to detect basically a tire air pressure and a rotation speed of a wheel. The acceleration sensor of the module structure of FIG. 20 is configured to detect a deformation of a cantilever La using a piezoelectric resistor element or the like to thereby detect whether the wheel rotates or not and the rotation speed thereof and is unable to detect the advancing direction of a vehicle or acceleration in the advancing direction with high accuracy.

In the pressure sensor of the module structure of FIG. 20, in order to thin the diaphragm Dp to increase sensitivity, it is generally necessary to form a deep concave portion Hp indicated by a dot line on the rear surface side of a silicon die opposite to the sealed space Kp. The module structure of FIG. 20 is generally manufactured in a wafer state, and the deep concave portion Hp is formed in respective chip formation regions on the rear surface side of the silicon wafer by performing anisotropic etching. However, since the anisotropic etching provides lower processing accuracy in the depth direction than the accuracy in the plane direction, the structure of the pressure sensor of the related art has a problem in that the depth of the concave portion Hp differs in respective chips, and the thickness of the diaphragm Dp becomes uneven.

SUMMARY

It is an object of the present disclosure to provide a compact dynamic quantity sensor device, in which a pressure sensor and a second dynamic quantity sensor are integrated as a module, and a method of manufacturing the same. Specifically, in an inexpensive dynamic quantity sensor device, a pressure sensor and a high-accuracy second dynamic quantity sensor are optimally integrated as modules, and the performance of the respective dynamic quantity sensors is not degraded even when they are configured as a module.

According to a first aspect of the present disclosure, a dynamic quantity sensor device includes: a first dynamic quantity sensor for detecting pressure as a first dynamic quantity; a second dynamic quantity sensor for detecting a second dynamic quantity other than the pressure; a first substrate made of a SOI substrate having a support substrate, an embedded oxide film and a SOI layer, which are stacked in this order; and a second substrate. The first dynamic quantity sensor and the second dynamic quantity sensor are integrated with each other. The first dynamic quantity sensor includes a first dynamic quantity detecting unit, which is displaceable according to the pressure. The second dynamic quantity sensor includes a second dynamic quantity detecting unit, which is displaceable according to the second dynamic quantity. The first dynamic quantity detecting unit and the second dynamic quantity detecting unit are disposed on a principal surface of the first substrate. The first dynamic quantity detecting unit is spaced apart from the second dynamic quantity detecting unit by a predetermined distance. The second substrate is bonded to the principal surface of the first substrate so as to cover the first dynamic quantity detecting unit and the second dynamic quantity detecting unit. The first substrate and the second substrate provide a first space and a second space. The first dynamic quantity detecting unit is air-tightly accommodated in the first space, and the second dynamic quantity detecting unit is air-tightly accommodated in the second space. The first space and the second space do not communicate with each other. The SOI layer is divided into a plurality of semiconductor regions by a plurality of trenches so that the plurality of semiconductor regions are electrically isolated from each other. Each trench reaches the embedded oxide film. A first part of the plurality of semiconductor regions provides the first dynamic quantity detecting unit. A second part of the plurality of semiconductor regions provides the second dynamic quantity detecting unit. The second part of the plurality of semiconductor regions includes: a second movable semiconductor region having a second movable electrode, which is displaceable and is provided by etching a part of the embedded oxide film as a sacrificial layer; and a second fixed semiconductor region having a second fixed electrode, which faces the second movable electrode. The second movable electrode and the second fixed electrode provide a capacitor having a dielectric layer, which is provided by space between the second movable electrode and the second fixed electrode. The second dynamic quantity sensor detects the second dynamic quantity by measuring a capacitance of the capacitor, which is changeable in accordance with displacement of the second movable electrode when the second movable electrode is displaced in response to the second dynamic quantity applied to the second dynamic quantity sensor.

In the above device, the dynamic quantity sensor device described above can be configured as a compact dynamic quantity sensor device in which the pressure sensor (the first dynamic quantity sensor) and the dynamic quantity sensor (the second dynamic quantity sensor) are integrated as a module, and can be configured as an inexpensive dynamic quantity sensor device in which the pressure sensor and the high-accuracy second dynamic quantity sensor are optimally integrated as a module, and the performance of the respective dynamic quantity sensors is not degraded even when they are integrated as modules.

According to a second aspect of the present disclosure, a method of manufacturing the dynamic quantity sensor device according to the first aspect, includes: preparing the first substrate including: forming the trenches in the SOI layer of the SOI substrate so as to provide the plurality of semiconductor regions; and forming the first dynamic quantity detecting unit and the second dynamic quantity detecting unit; preparing the second substrate in such a manner that the first space and the second space are provided by the first substrate and the second substrate, and the first space and the second space do not communicate with each other when the second substrate is bonded to the principal surface of the first substrate; and bonding the second substrate to the principal surface of the first substrate.

In the above method, the dynamic quantity sensor device described above can be configured as a compact dynamic quantity sensor device in which the pressure sensor (the first dynamic quantity sensor) and the dynamic quantity sensor (the second dynamic quantity sensor) are integrated as a module, and can be configured as an inexpensive dynamic quantity sensor device in which the pressure sensor and the high-accuracy second dynamic quantity sensor are optimally integrated as a module, and the performance of the respective dynamic quantity sensors is not degraded even when they are integrated as modules.

According to a third aspect of the present disclosure, a method of manufacturing the dynamic quantity sensor device according to the first aspect, includes: preparing a first substrate including: forming the trenches in the SOI layer so as to provide the plurality of semiconductor regions; and forming the first dynamic quantity detecting unit and the second dynamic quantity detecting unit; preparing the second substrate in such a manner that the first space and the second space are provided by the first substrate and the second substrate, and the first space and the second space do not communicate with each other when the second substrate is bonded to the principal surface of the first substrate; and bonding the second substrate to the principal surface of the first substrate. The preparing of the first substrate further includes: depositing a first polycrystal silicon layer on an oxide film, which is formed on the supporting substrate so that the oxide film provides the embedded oxide film, and the first polycrystal silicon layer provides a part of the SOI layer; depositing a second polycrystal silicon layer on the first polycrystal silicon layer so that an opening of an auxiliary trench is closed in order to form the hollow portion, and a stacked structure of the first polycrystal silicon layer and the second polycrystal silicon layer provides the SOI layer after forming the auxiliary trench in the first polycrystal silicon layer so as to reach the embedded oxide film; and forming the trenches to provide the first semiconductor region having the first wall portion and the second semiconductor region having the second wall portion.

In the above method, the dynamic quantity sensor device described above can be configured as a compact dynamic quantity sensor device in which the pressure sensor (the first dynamic quantity sensor) and the dynamic quantity sensor (the second dynamic quantity sensor) are integrated as a module, and can be configured as an inexpensive dynamic quantity sensor device in which the pressure sensor and the high-accuracy second dynamic quantity sensor are optimally integrated as a module, and the performance of the respective dynamic quantity sensors is not degraded even when they are integrated as modules.

BRIEF DESCRIPTION OF THE DRAWINGS

The above and other objects, features and advantages of the present disclosure will become more apparent from the following detailed description made with reference to the accompanying drawings. In the drawings:

FIGS. 1A and 1B are diagrams illustrating an example of a dynamic quantity sensor device according to the present disclosure, in which FIG. 1A is a diagram illustrating the cross-section of a main part of a dynamic quantity sensor device, and FIG. 1B is a top view of the dynamic quantity sensor device;

FIGS. 2A and 2B are diagrams illustrating a more specific configuration example of a first dynamic quantity sensor (pressure sensor) illustrated in FIGS. 1A and 1B, in which FIG. 2A is a plan view illustrating a configuration example of a first dynamic quantity detecting unit, and FIG. 2B is a cross-sectional view taken along the one-dot chain line IIB-IIB in FIG. 2A;

FIGS. 4A to 4E are cross-sectional views illustrating each step of an example of a method of manufacturing the dynamic quantity sensor device, in which FIGS. 4A to 4E are diagrams illustrating a step of preparing a first substrate illustrated in FIG. 1A;

FIGS. 5A to 5C are cross-sectional views illustrating each step of an example of a method of manufacturing the dynamic quantity sensor device, in which FIGS. 5A to 5C are diagrams illustrating a step of preparing a first substrate illustrated in FIG. 1A;

FIGS. 7A and 7B are cross-sectional views illustrating each step of an example of a method of manufacturing the dynamic quantity sensor device, in which FIG. 7A is a diagram illustrating a substrate bonding step of bonding the second substrate to a principal surface side of the first substrate, and FIG. 7B is a diagram illustrating a step of sealing a second space of the second dynamic quantity sensor (acceleration sensor), which is performed after the first substrate and the second substrate are bonded;

FIGS. 10A to 10C are cross-sectional views illustrating each step of an example of a method of manufacturing the dynamic quantity sensor device, in which FIGS. 10A to 10C are diagrams illustrating a step of preparing a second substrate of the dynamic quantity sensor device before bonding;

FIGS. 11A to 11C are cross-sectional views illustrating each step of an example of a method of manufacturing the dynamic quantity sensor device, in which FIGS. 11A to 11C are diagrams illustrating a step of bonding the first substrate and the second substrate and, a step of forming a wiring after bonding;

FIGS. 12A and 12B are cross-sectional views illustrating each step of an example of a method of manufacturing the dynamic quantity sensor device, in which FIGS. 12A and 12B are diagrams illustrating a step of forming the wiring after bonding and a step of sealing a second space of the second dynamic quantity sensor (acceleration sensor);

FIGS. 14A and 14B are cross-sectional views illustrating another configuration example of the first dynamic quantity detecting unit of the first dynamic quantity sensor (pressure sensor) illustrated in FIGS. 1A and 1B and FIGS. 2A and 2B, in which FIG. 14A is a diagram illustrating the state of a medium to be measured before pressure is applied, and FIG. 14B is a diagram illustrating the state after pressure is applied;

FIGS. 19A and 19B are diagrams illustrating a dynamic quantity sensor device having a different acceleration sensor, in which FIG. 19A is a diagram illustrating the cross-section of a main part of the dynamic quantity sensor device, and FIG. 19B is a top view of the dynamic quantity sensor device.

DETAILED DESCRIPTION

Figure 1A:
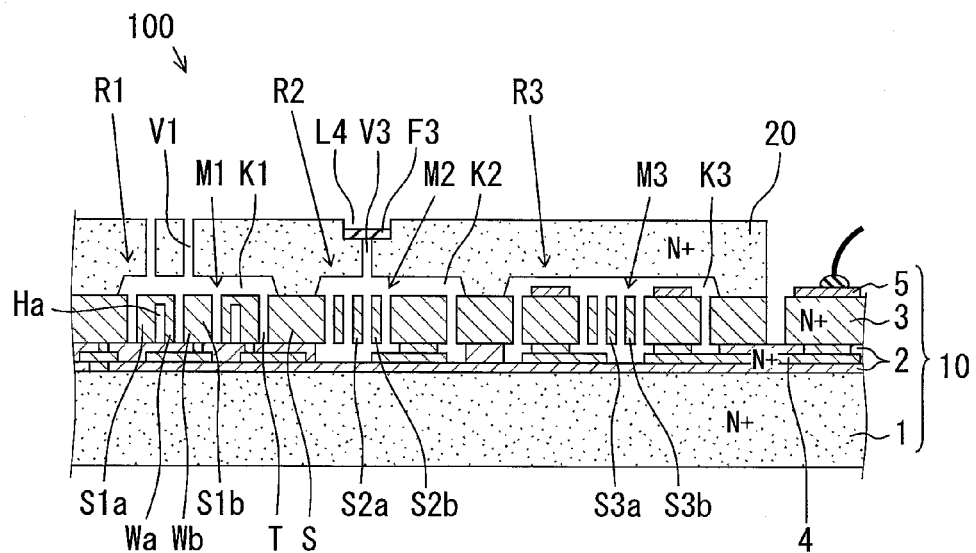
Figure 1B:
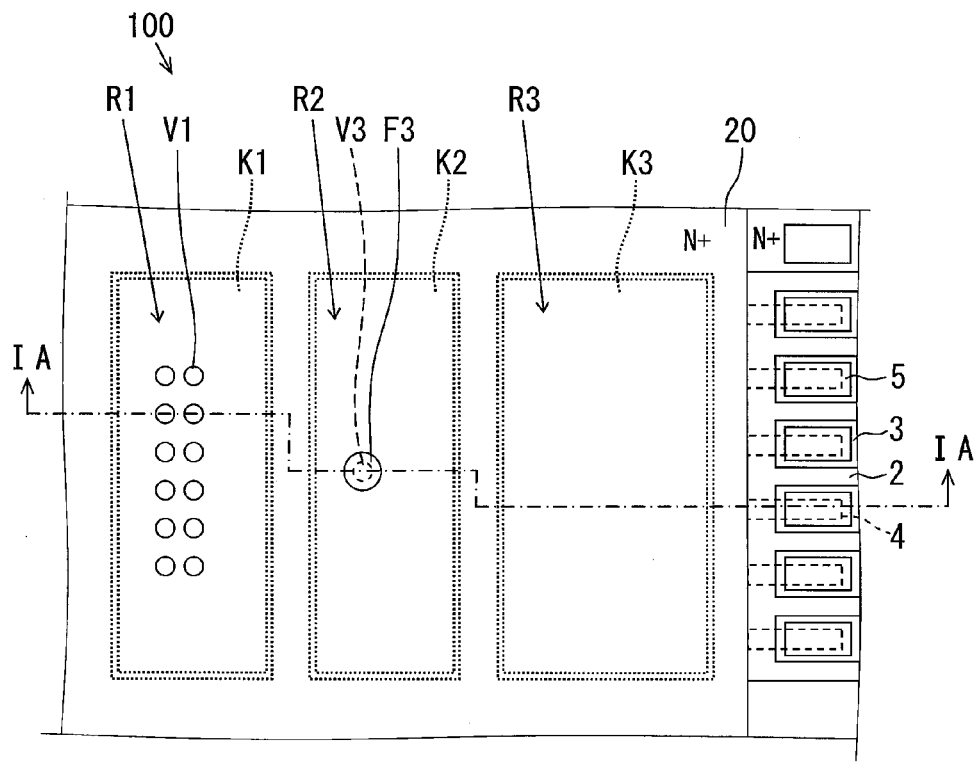

FIGS. 1A and 1B are diagrams illustrating an example of a dynamic quantity sensor device according to the present disclosure, in which FIG. 1A is a diagram illustrating the cross-section of a main part of a dynamic quantity sensor device 100, and FIG. 1B is a top view of the dynamic quantity sensor device 100. FIG. 1A corresponds to the cross-section taken along the one-dot chain line IA-IA in FIG. 1B.

The dynamic quantity sensor device 100 illustrated in FIGS. 1A and 1B is a dynamic quantity sensor device in which a first dynamic quantity sensor (pressure sensor) R1 that detects pressure as a first dynamic quantity, a second dynamic quantity sensor (acceleration sensor) R2 that detects acceleration as a second dynamic quantity, and a third dynamic quantity sensor (angular velocity sensor) R3 that detects angular velocity as a third dynamic quantity are integrated.

As illustrated in FIG. 1A, a first dynamic quantity detecting unit M1 of the first dynamic quantity sensor R1 displaced with pressure, a second dynamic quantity detecting unit M2 of the second dynamic quantity sensor R2 displaced with acceleration, and a third dynamic quantity detecting unit M3 of the third dynamic quantity sensor R3 displaced with angular velocity are formed on a principal surface side of a first substrate 10 formed of a semiconductor in a displaceable state with a predetermined space interposed. Moreover, a second substrate 20 covering the first dynamic quantity detecting unit M1, the second dynamic quantity detecting unit M2, and the third dynamic quantity detecting unit M3 with a predetermined space interposed is bonded to the principal surface side of the first substrate 10. By the first substrate 10 and the second substrate 20 bonded to each other, a first space K1, a second space K2, and a third space K3 that airtightly accommodate the first dynamic quantity detecting unit M1, the second dynamic quantity detecting unit M2, and the third dynamic quantity detecting unit M3 in a displaceable state are formed so as not to communicate each other.

As illustrated in FIG. 1A, the first substrate 10 is an SOI (Silicon On Insulator) substrate including a supporting substrate 1, an SOI layer 3, and an embedded oxide film 2 interposed therebetween. In the first substrate 10, semiconductor regions S including a plurality of SOI layers 3 isolated from the surroundings by trenches T reaching the embedded oxide film 2 are formed. In the dynamic quantity sensor device 100 of FIGS. 1A and 1B, the first dynamic quantity detecting unit M1 of the first dynamic quantity sensor R1 is formed of a part of these semiconductor regions S, the second dynamic quantity detecting unit M2 of the second dynamic quantity sensor R2 is formed of another part thereof, and the third dynamic quantity detecting unit M3 of the third dynamic quantity sensor R3 is formed of still another part thereof. The dynamic quantity sensor device 100 of FIGS. 1A and 1B employs a configuration in which a wiring 4 connected to the first dynamic quantity detecting unit M1, the second dynamic quantity detecting unit M2, and the third dynamic quantity detecting unit M3 is formed within the embedded oxide film 2. Moreover, a metal pattern 5 for realizing electrical connection to the outside is formed in a semiconductor region S of the first substrate 10 which is not covered by the second substrate 20 connected to the wiring 4.

As illustrated in FIG. 1A, the first dynamic quantity detecting unit M1 of the first dynamic quantity sensor (pressure sensor) R1 of the dynamic quantity sensor device 100 of FIGS. 1A and 1B includes at least one first semiconductor region S1a and at least one second semiconductor region S1b. The first semiconductor region S1a is a semiconductor region which includes a first wall portion Wa formed in a direction crossing the embedded oxide film 2 as a first electrode, and in which a hollow portion Ha is formed so that the first wall portion Wa is thinned, and the first wall portion Wa is formed so as to be deformed and displaced as a diaphragm. The second semiconductor region S1b is a semiconductor region which includes a second wall portion Wb facing the first wall portion Wa as a second electrode.

The first dynamic quantity detecting unit M1 of the first dynamic quantity sensor (pressure sensor) R1 illustrated in FIG. 1A has a configuration in which a capacitance is formed so that a space between the opposing surfaces of the first electrode (the first wall portion Wa) and the second electrode (the second wall portion Wb) is used as a dielectric layer, at least the first electrode is deformed and displaced in a direction vertical to the opposing surface of the second electrode in accordance with the pressure of a medium to be measured, and a change of a capacitance due to a change of the space between the first electrode and the second electrode is measured to thereby detect pressure.

That is, in the first dynamic quantity sensor R1 having the configuration illustrated in FIGS. 1A and 1B, the hollow portion Ha of the first semiconductor region S1a is sealed in a predetermined reference pressure (for example, vacuum), and a first through hole V1 is formed so as to penetrate through the second substrate 20 so that the outside of the second substrate 20 communicates with the first space K1. Moreover, at least the first electrode (the first wall portion Wa) is configured to be deformed and displaced in a direction vertical to the opposing surface of the second electrode (the second wall portion Wb) in accordance with the pressure of the medium to be measured introduced to the first space K1 via the first through hole V1.

Figure 2A:
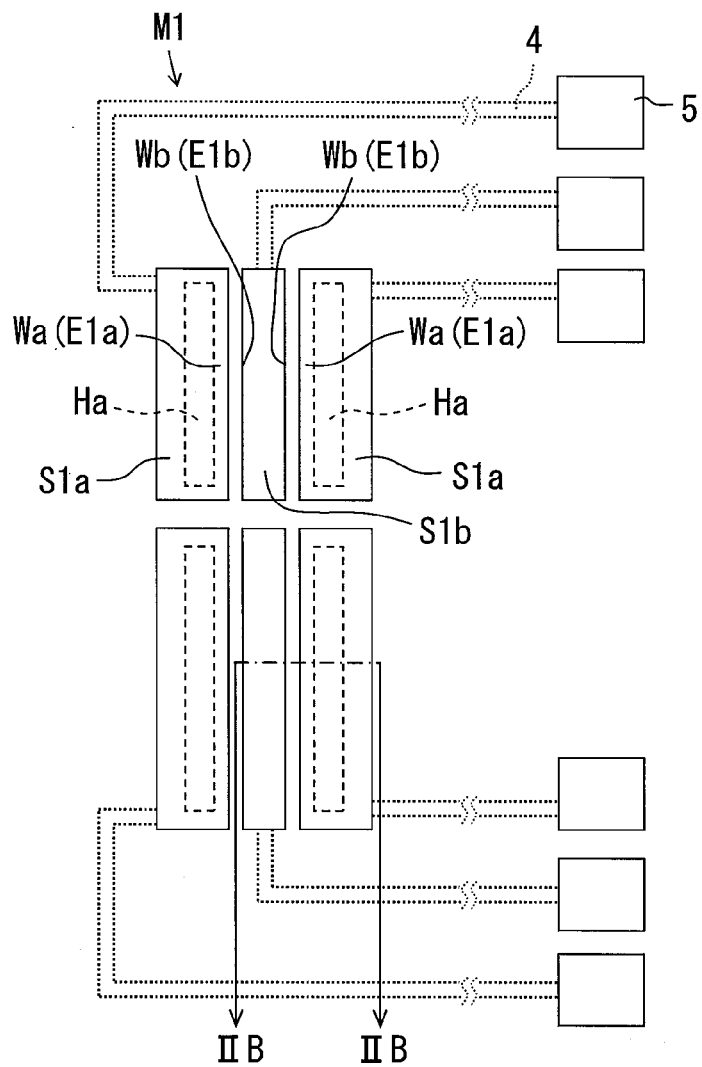
Figure 2B:
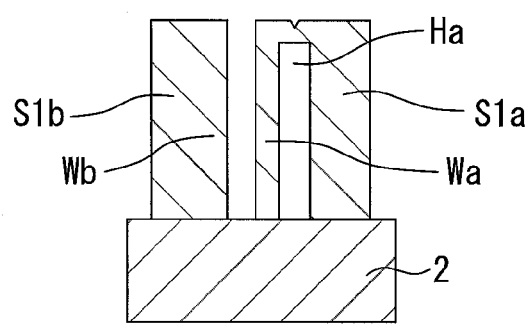

FIGS. 2A and 2B are diagrams illustrating a more specific configuration example of a first dynamic quantity sensor (pressure sensor) R1 illustrated in FIGS. 1A and 1B, in which FIG. 2A is a plan view illustrating a configuration example of a first dynamic quantity detecting unit M1, and FIG. 2B is a cross-sectional view taken along the one-dot chain line IIB-IIB in FIG. 2A.

The first dynamic quantity detecting unit M1 illustrated in FIG. 2A includes four first semiconductor regions S1a in which the vacuum hollow portion Ha is formed and two second semiconductor regions S1b in which the hollow portion Ha is not formed. The first semiconductor region S1a includes the first wall portion Wa which is thinned by the hollow portion Ha, and the first wall portion Wa functions as a diaphragm which is deformed and displaced in accordance with the pressure of the medium to be measured. Moreover, the second semiconductor region S1b includes the second wall portion Wb facing the first wall portion Wa. The first wall portion Wa and the second wall portion Wb form a set of electrodes, that is, a first electrode E1a and a second electrode E1b, of a capacitor element that measures a change of capacitance in accordance with the pressure of the medium to be measured.

In the first dynamic quantity sensor (pressure sensor) R1 illustrated in FIGS. 1A and 1B, the size and the number of the first semiconductor regions S1a and the second semiconductor regions S1b and the area and the thickness of the first wall portion Wa functioning as a diaphragm are set appropriately depending on the range of pressure to be measure and a required measurement sensitivity similarly to the first dynamic quantity detecting unit M1 illustrated in FIG. 2A.

The second dynamic quantity detecting unit M2 of the second dynamic quantity sensor (acceleration sensor) R2 of the dynamic quantity sensor device 100 of FIGS. 1A and 1B includes at least one second movable semiconductor region S2a and at least one second fixed semiconductor region S2b. The second movable semiconductor region S2a is a semiconductor region which includes a second movable electrode formed to be displaceable by etching a part of the embedded oxide film 2 as a sacrificial layer. The second fixed semiconductor region S2b is a semiconductor region which includes a second fixed electrode facing the second movable electrode.

The second dynamic quantity detecting unit M2 of the second dynamic quantity sensor (acceleration sensor) R2 illustrated in FIG. 1A has a configuration in which a capacitance is formed so that a space between the opposing surfaces of the second movable electrode and the second fixed electrode is used as a dielectric layer, the second movable electrode is displaced in a direction vertical to the opposing surface in accordance with applied, acceleration, and a change of capacitance due to a change of the space between the second movable electrode and the second fixed electrode is measured to thereby detect acceleration.

Moreover, in the second dynamic quantity sensor R2, which is an acceleration sensor, of the dynamic quantity sensor device 100 of FIGS. 1A and 1B, the second space K2 is sealed in a predetermined pressure such as a nitrogen ($N_2$) atmosphere of 1 atmospheric pressure, for example, in order to prevent stiction (phenomenon where a movable portion adheres to the surroundings due to surface tension or the like and becomes difficult to move) of the second movable semiconductor region S2a and to suppress unnecessary high-frequency vibration. Thus, in the second dynamic quantity sensor R2 illustrated in FIGS. 1A and 1B, a third through hole V3 and a concave portion L4 are formed so as to penetrate through the second substrate 20 so that the outside of the second substrate 20 communicates with the second space K2. Moreover, in the second substrate 20, a sealing member F3 that seals the third through hole V3 is disposed on the outer surface opposite to the surface bonded to the first substrate 10 over the entire bottom surface of the concave portion L4 so as not to protrude from the outer surface of the second substrate 20. In other words, in the second dynamic quantity sensor R2 of the dynamic quantity sensor device 100 illustrated in FIGS. 1A and 1B, the maximum height of the sealing member 4 from the bonding surface of the first substrate 10 and the second substrate 20 is set to be lower than the maximum height of the outer surface of the second substrate 20 from the bonding surface.

In forming the sealing member F, an ink jet method, a mask deposition method, a screen printing method, and the like can be used. For example, a stacked film of titanium (Ti), nickel (Ni), gold (Au), and solder may be formed on the bottom surface of the concave portion L4 in that order from bottom to top as the sealing member F, and the second space K2 may be airtightly sealed by heating the stacked film.

Figure 3:
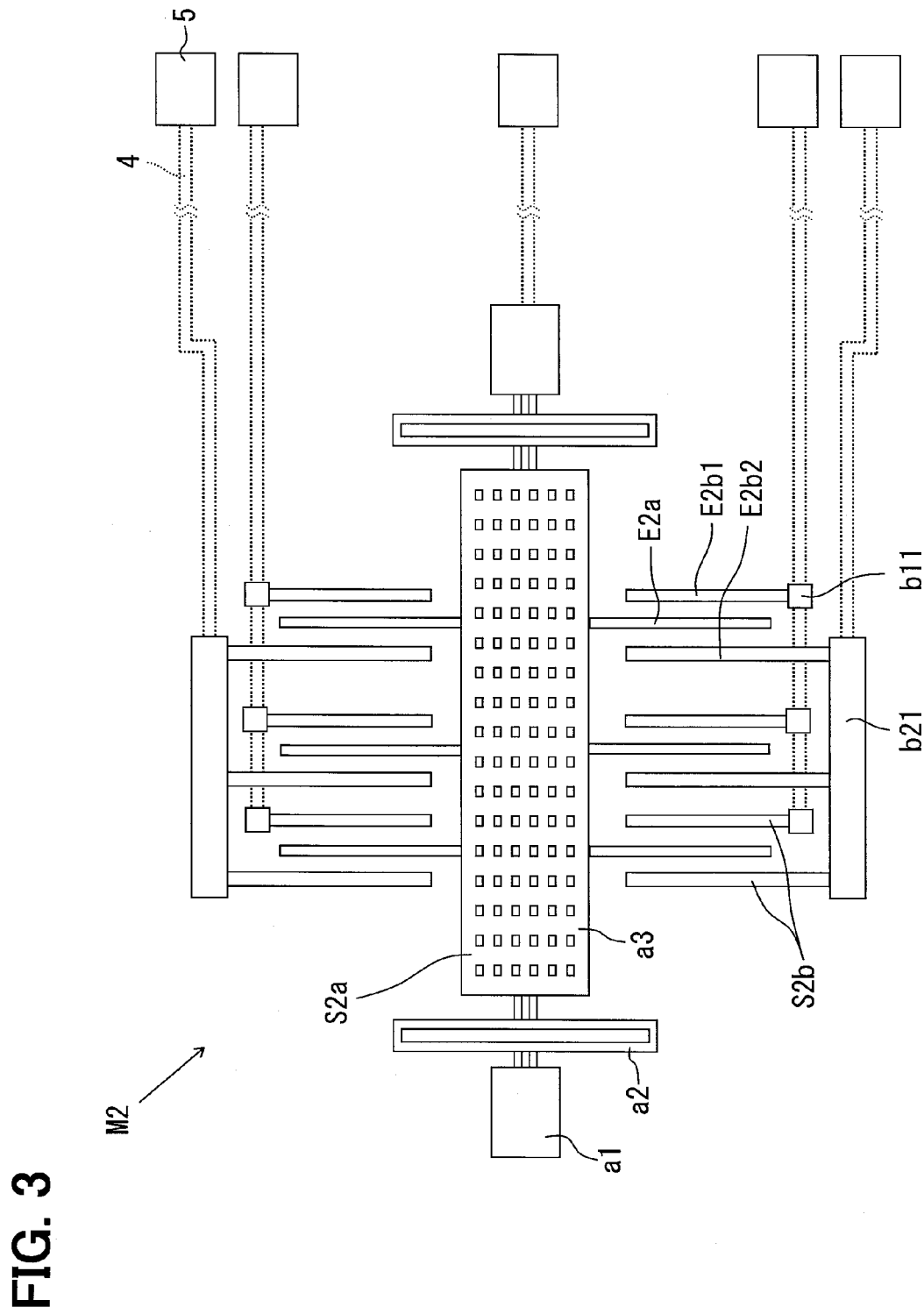
FIG. 3 is a diagram illustrating a more specific configuration example of a second dynamic quantity sensor (acceleration sensor) illustrated in FIGS. 1A and 1B, and is a plan view illustrating a configuration example of a second dynamic quantity detecting unit.

FIG. 3 is a diagram illustrating a more specific configuration example of the second dynamic quantity sensor (acceleration sensor) R2 illustrated in FIGS. 1A and 1B, and is a plan view illustrating a configuration example of the second dynamic quantity detecting unit M2.

The second dynamic quantity detecting unit M2 illustrated in FIG. 3 has a configuration in which one second movable electrode E2a is inserted between two second fixed electrodes E2b1 and E2b2. In the second movable semiconductor region S2a illustrated in FIG. 3, reference numeral a1 is an anchor portion, reference numeral a2 is a rectangular spring portion supported by the anchor portional, and reference numeral a3 is a weight portion connected to the spring portion a2. The second movable electrodes E2a are formed on both sides of the weight portion a3 in a comb shape. Reference numerals b11 and b21 in the second semiconductor region S1b are also anchor portions. The third dynamic quantity detecting unit M3 of the third dynamic quantity sensor (angular velocity sensor) R3 of the dynamic quantity sensor device 100 of FIGS. 1A and 1B includes at least one third movable semiconductor region S3a and at least one third fixed semiconductor region S3b as illustrated in FIG. 1A. The third movable semiconductor region S3a is a semiconductor region which includes a third movable electrode formed to be displaceable by etching a part of the embedded oxide film 2 as a sacrificial layer. The third fixed semiconductor region S3b is a semiconductor region which includes a third fixed electrode facing the third movable electrode.

The third movable semiconductor region S3a (the third movable electrode) of the third dynamic quantity sensor R3 that detects angular velocity is used for detecting angular velocity (Coriolis force) in a state where a region not illustrated herein is vibrated at a high frequency in a direction orthogonal to the opposing surface. That is, the third dynamic quantity detecting unit M3 of the third dynamic quantity sensor (angular velocity sensor) R3 illustrated in FIG. 1A has a configuration in which a capacitance is formed so that a space between the opposing surfaces of the third movable electrode and the third fixed electrode is used as a dielectric layer, the third movable electrode is displaced in a direction vertical to the opposing surface in accordance with the Coriolis force of applied angular velocity, and a change of capacitance due to a change of the opposing distance between the third movable electrode and the third fixed electrode is measured to thereby detect angular velocity.

Moreover, in the third dynamic quantity sensor R3, of the dynamic quantity sensor device 100 of FIGS. 1A and 1B, which is an angular velocity sensor (Coriolis force sensor), the third movable electrode (the third movable semiconductor region S3a) which is a vibrating body is vibrated at a desired high frequency and a desired amplitude, and a displacement is detected based on the Coriolis force (proportional to angular velocity) of the vibrating body. Thus, the third space K3 is sealed in vacuum where vibration is hardly attenuated. The third dynamic quantity sensor R3 may be configured as a Lorentz force sensor that detects a change of capacitance of a vibrating body which is vibrated at a desired high frequency and desired amplitude based on the Lorentz force using the same structure. By configuring the third dynamic quantity sensor R3 as a Lorentz force sensor, it is possible to detect the direction of a vehicle in relation to the direction of geomagnetism, for example.

As above, the dynamic quantity sensor device 100 illustrated in FIGS. 1A and 1B is a compact dynamic quantity sensor device in which the first dynamic quantity sensor (pressure sensor) R1 that detects pressure, the second dynamic quantity sensor (acceleration sensor) R2 that detects acceleration, and the third dynamic quantity sensor (angular velocity sensor) R3 that detects angular velocity are integrated as modules.

In the dynamic quantity sensor device 100, an SOI substrate including the supporting substrate 1, the SOI layer 3, and the embedded oxide film 2 interposed therebetween is used as the first substrate 10 that forms the first dynamic quantity sensor R1, the second dynamic quantity sensor R2, and the third dynamic quantity sensor R3. Moreover, the first dynamic quantity detecting unit M1 of the first dynamic quantity sensor R1, the second dynamic quantity detecting unit M2 of the second dynamic quantity sensor R2, and the third dynamic quantity detecting unit M3 of the third dynamic quantity sensor R3 are formed of the semiconductor regions S which include a plurality of SOI layers 3 isolated from the surroundings by the trenches T reaching the embedded oxide film 2. Thus, the first dynamic quantity detecting unit M1, the second dynamic quantity detecting unit M2, and the third dynamic quantity detecting unit M3 can be formed simultaneously by sharing the step of forming the trenches T and the like, and the manufacturing cost can be decreased.

Furthermore, the second substrate 20 is bonded to the principal surface side of the first substrate 10 in which the first dynamic quantity detecting unit M1, the second dynamic quantity detecting unit M2, and the third dynamic quantity detecting unit M3 are formed, and the first dynamic quantity sensor R1, the second dynamic quantity sensor R2, and the third dynamic quantity sensor R3 are airtightly accommodated in the first space K1, the second space K2, and the third space K3, respectively, which do not communicate with each other. Thus, the first space K1 in which the first dynamic quantity sensor R1 is accommodated, the second space K2 in which the second dynamic quantity sensor R2 is accommodated, and the third space K3 in which the third dynamic quantity sensor R3 is accommodated can be controlled to be in different environmental conditions where the performance of the respective dynamic quantity sensors is optimized. For example, in the dynamic quantity sensor device 100 of FIGS. 1A and 1B, the pressure of the second space K2 in which the second dynamic quantity sensor R2 which is an acceleration sensor is accommodated can be set to a nitrogen ($N_2$) atmosphere of 1 atmospheric pressure independently from the pressure of the medium to be measured, of the first space K1 in which the first dynamic quantity sensor R1 which is a pressure sensor is accommodated. Moreover, the pressure of the third space K3 in which the third dynamic quantity sensor R3 which is an angular velocity sensor is accommodated can be set to vacuum independently from the nitrogen ($N_2$) atmosphere of 1 atmospheric pressure, of the second space K2 in which the second dynamic quantity sensor R2 which is an acceleration sensor is accommodated. In this way, in the dynamic quantity sensor device 100 of FIGS. 1A and 1B, since the respective dynamic quantity sensors R1 to R3 are airtightly accommodated in the spaces K1 to K3 which do not communicate with each other, it is possible to prevent degradation of performance due to interference of the respective dynamic quantity sensors R1 to R3.

In this way, the dynamic quantity sensor device 100 illustrated in FIGS. 1A and 1B is a compact dynamic quantity sensor device in which a pressure sensor (the first dynamic quantity sensor R1), an acceleration sensor (the second dynamic quantity sensor R2), and an angular velocity sensor (the third dynamic quantity sensor R3) are integrated as modules, and is an inexpensive dynamic quantity sensor device in which a pressure sensor and high-accuracy dynamic quantity sensors (an acceleration sensor and an angular velocity sensor) are optimally integrated as modules, and the performance of the respective dynamic quantity sensors is not degraded even when they are integrated as modules.

Next, the respective dynamic quantity sensors R1 to R3 of the dynamic quantity sensor device 100 of FIGS. 1A and 1B will be described in more detail.

The first dynamic quantity sensor (pressure sensor) R1 including the first dynamic quantity detecting unit M1, of the dynamic quantity sensor device 100 is a capacitance-type pressure sensor that measures a deformational displacement of the first wall portion (diaphragm) Wa due to the pressure of the medium to be measured as a change of capacitance. The first electrode (the first wall portion Wa) and the second electrode (the second wall portion Wb) of the first dynamic quantity detecting unit M1 having the above configuration are formed of the semiconductor regions S1a and S1b (the SOI layer 3) of the same conductivity type (N+), and a PN junction is not present. Therefore, since the unstable state of capacitance detection characteristics due to the PN junction does not occur, it is possible to maintain very stable capacitance detection characteristics against disturbance such as temperature or an external atmosphere.

Moreover, according to the first dynamic quantity sensor R1 having the above configuration, it is possible to set the thickness of the first wall portion Wa functioning as a diaphragm independently from the thickness of the SOI layer 3. Thus, it is possible to set the thickness of the SOI layer 3, for example, so as to be optimal for the second movable semiconductor region S2a of the second dynamic quantity sensor R2. Moreover, it is possible to set the thickness of the first wall portion Wa functioning as the diaphragm of the first dynamic quantity sensor R1 so as to be optimal for detection of the pressure of the medium to be measured.

Furthermore, according to the first dynamic quantity sensor R1 having the above configuration, it is possible to increase the sensitivity easily as compared to the pressure sensor of the related art in which a piezoelectric resistor element detects a diaphragm formed in parallel to the embedded oxide film of the SOI substrate and the deformation of the diaphragm. That is, in the structure of the pressure sensor of the related art, since the sensitivity is increased by thinning the diaphragm, it is generally necessary to form a deep concave portion on the supporting substrate side of the SOI substrate by anisotropic etching. However, since the anisotropic etching provides lower processing accuracy in the depth direction than the accuracy in the plane direction determined by a mask, the structure of the pressure sensor of the related art has a problem in that the depth of the concave portion differs in respective chips, and the thickness of the diaphragm becomes uneven. In contrast, according to the first dynamic quantity sensor R1 having the above configuration illustrated in FIGS. 1A and 1B, the trench is processed by the anisotropic etching so that the thickness of the SOI layer is maximized, and as illustrated by the manufacturing method described later, the thickness of the first wall portion Wa functioning as the diaphragm can be secured with the accuracy in the in-plane direction determined by the mask.

As above, the configuration of the first capacitance-type dynamic quantity sensor R1 illustrated in FIGS. 1A and 1B is ideal as a pressure sensor which is formed integrally with a capacitance-type and high-accuracy dynamic quantity sensor such as an acceleration sensor on one SOI substrate.

The second dynamic quantity sensor (acceleration sensor) R2 of the dynamic quantity sensor device 100 is configured to measure a change of capacitance between the second movable electrode (the second movable semiconductor region S2a) formed to be displaceable and the second fixed electrode (the second fixed semiconductor region S2b) to thereby detect acceleration. As above, the second dynamic quantity sensor R2 is also a capacitance-type sensor and is a high-accuracy acceleration sensor as compared to an acceleration sensor that detects a deformation of the cantilever La illustrated in FIG. 20, for example, using a piezoelectric resistor element or the like.

Moreover, the third dynamic quantity sensor (angular velocity sensor) R3 of the dynamic quantity sensor device 100 is also configured to measure a change of capacitance between the third movable electrode (the third movable semiconductor region S3a) formed to be displaceable and the third fixed electrode (the third fixed semiconductor region S3b) to thereby detect angular velocity. As above, the third dynamic quantity sensor R3 is also a capacitance-type sensor and can be used as a high-accuracy angular velocity sensor (gyrosensor).

Next, a method of manufacturing the dynamic quantity sensor device 100 illustrated in FIGS. 1A and 1B will be described.

FIGS. 4A to FIG. 7B are cross-sectional views of each step of an example of a method of manufacturing the dynamic quantity sensor device 100 illustrated in FIGS. 1A and 1B.

FIGS. 4A to 4E and FIGS. 5A to 5E are diagrams illustrating a step of preparing the first substrate 10 illustrated in FIG. 1A. In the step of preparing the first substrate 10, trenches T are formed in the SOI layer 3 of the SOI substrate to form a plurality of semiconductor regions S, and the first dynamic quantity detecting unit M1, the second dynamic quantity detecting unit M2, and the third dynamic quantity detecting unit M3 are formed.

First, a single-crystal silicon substrate having a thickness of 200 to 500 μm, for example, and having the (100) surface is used as the supporting substrate 1 which is a constituent component of the first substrate 10 illustrated in FIG. 1A. The supporting substrate 1 formed of single-crystal silicon has a specific resistance of 0.001 to 0.1 Ω·cm and an N-type and contains impurities of high concentration such as arsenic (As) or phosphorus (P), and is denoted as "N+" in FIG. 4A.

Figure 4A:
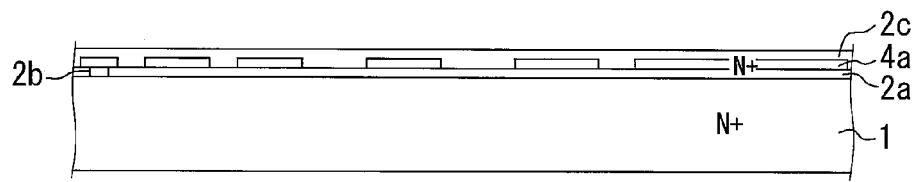

Subsequently, as illustrated in FIG. 4A, the single-crystal silicon substrate 1 is thermally oxidized at a temperature of 1000 to 1100° C. to form the ($SiO_2$) thermally oxidized film 2a having a thickness of 0.5 to 1.5 μm. After that, a first contact hole 2b is formed in the thermally oxidized film 2a so as to reach the single-crystal silicon substrate 1.

Subsequently, a high-concentration N+type polycrystal silicon is deposited on the entire surface to a thickness of 0.1 to 2 μm by a CVD method so as to bury the first contact hole 2b, and a predetermined wiring pattern is formed by a photolithography method and etching. In FIG. 4A, the wiring pattern is illustrated as a polycrystal silicon wiring 4a.

Subsequently, an ($SiO_2$) oxide film 2c is formed on the entire surface to a thickness of 0.5 to 2.0 μm by a CVD method, a sputtering method, or the like. The thermally oxidized film 2a formed first and the oxide film 2c formed subsequently become the embedded oxide film 2 of the first substrate 10 illustrated in FIG. 1A.

Figure 4B:
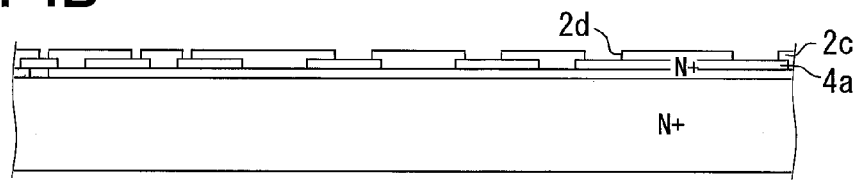

Subsequently, as illustrated in FIG. 4B, a second contact hole 2d is formed in the oxide film 2c so as to reach the polycrystal silicon wiring 4a.

Figure 4C:
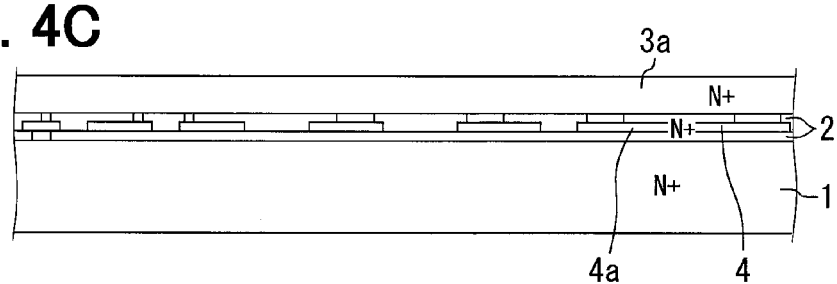

Subsequently, as illustrated in FIG. 4C, an N+type first polycrystal silicon layer 3a is formed on the entire surface to a thickness of 5 to 100 μm. In this example, the polycrystal silicon layer 3a is formed to a thickness of about 20 μm. The polycrystal silicon wiring 4a and the first polycrystal silicon layer 3a embedded in the second contact hole 2d form a wiring 4 in the embedded oxide film 2 illustrated in FIG. 1A.

In this way, when manufacturing the dynamic quantity sensor device 100 of FIGS. 1A and 1B, in the step of preparing the first substrate 10, before forming the SOI layer 3 of FIG. 1A, the wiring 4 connecting the first dynamic quantity detecting unit M1, the second dynamic quantity detecting unit M2, and the third dynamic quantity detecting unit M3 is formed in advance at a predetermined position in the embedded oxide film 2.

Figure 4D:
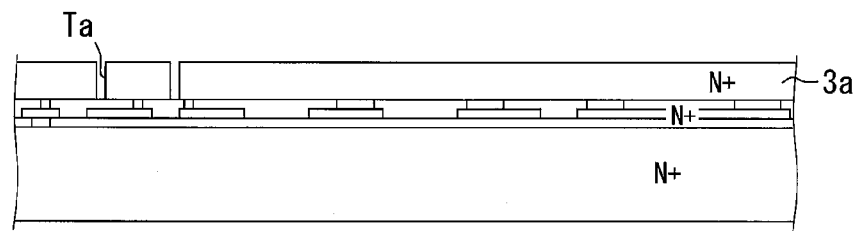

Subsequently, in order to form the hollow portion Ha of the first dynamic quantity sensor (pressure sensor) R1 illustrated in FIG. 1A, an auxiliary trench Ta having a thickness of 1 to 2 μm is formed in the first polycrystal silicon layer 3a as illustrated in FIG. 4D.

Figure 4E:
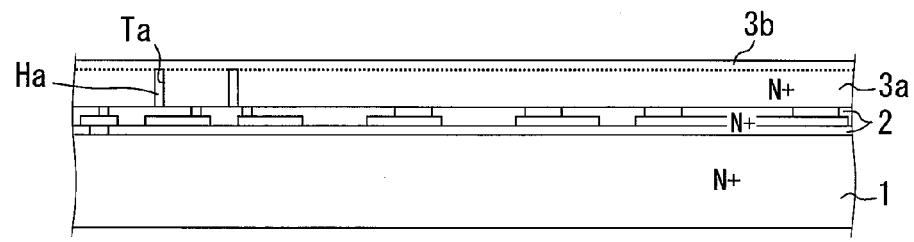

Subsequently, as illustrated in FIG. 4E, an N+type second polycrystal silicon layer 3b is formed to a thickness of 2 to 3 μm in vacuum by a sputtering method or the like so as to close the upper portion of the auxiliary trench Ta. In this way, the closed auxiliary trench Ta becomes the hollow portion Ha of the first dynamic quantity sensor, (pressure sensor) R1, and the hollow portion Ha becomes a reference pressure chamber of vacuum. Moreover, the first polycrystal silicon layer 3a and the second polycrystal silicon layer 3b form the SOI layer 3 of the first substrate 10 illustrated in FIG. 1A.

Figure 5A:
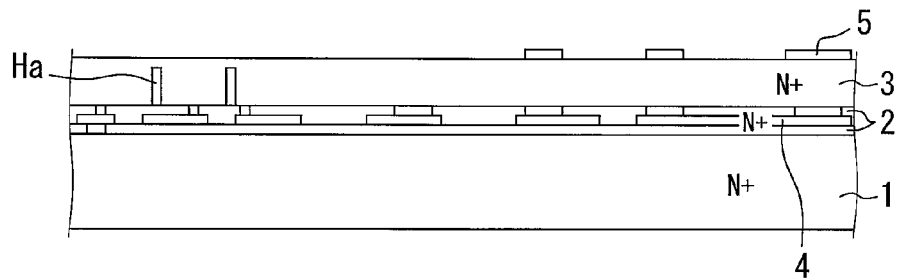

Subsequently, as illustrated in FIG. 5A, an aluminum (Al) film is deposited on the entire surface of the SOI layer 3 to a thickness of 0.1 to 1 μM, and a metal pattern 5 illustrated in FIG. 1A is formed as a predetermined pattern by a photolithography method and etching.

Figure 5B:
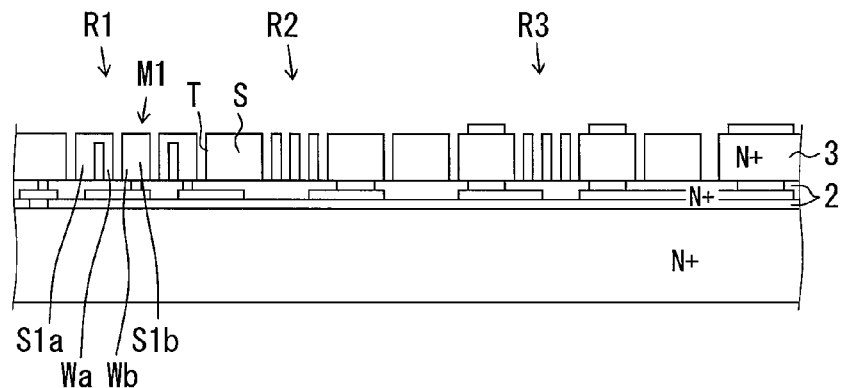

Subsequently, in order to form the first dynamic quantity sensor (pressure sensor) R1, the second dynamic quantity sensor (acceleration sensor) R2, and the third dynamic quantity sensor (angular velocity sensor) R3 illustrated in FIG. 1A, trenches T are formed so as to reach the embedded oxide film 2 to thereby divide the SOI layer 3 into a plurality of predetermined semiconductor regions S as illustrated in FIG. 5B. In this way, the first semiconductor region S1a including the first wall portion Wa, the second semiconductor region S1b including the second wall portion Wb, and the like are formed in the formation portion of the first dynamic quantity sensor (pressure sensor) R1, whereby the first dynamic quantity detecting unit M1 is obtained. The first wall portion Wa functioning as the diaphragm typically has a thickness of 1 to 2 μm and is further thickened or thinned depending on the pressure to be measured.

Figure 5C:
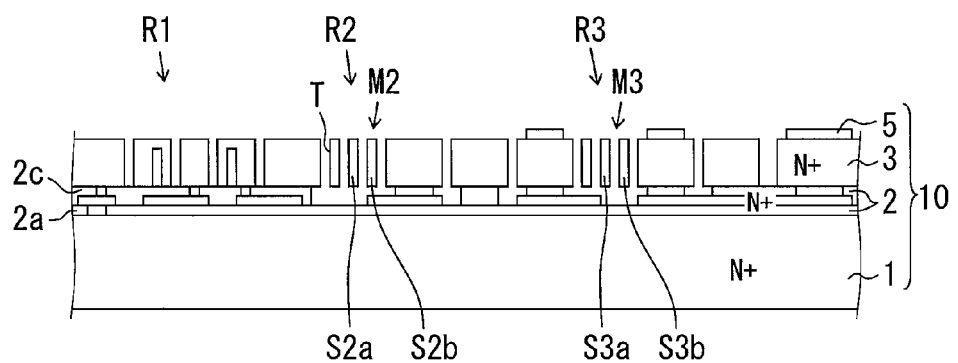

Subsequently, a resist mask (not illustrated) is formed on a predetermined region of the SOI layer 3 by attaching a film resist, and a predetermined region of the embedded oxide film 2 is etched and removed via a part of the trenches T formed in the previous step as illustrated in FIG. 5C. Although in FIG. 5C, only the oxide film 2c which is the upper layer constituting the embedded oxide film 2 is removed, the thermally oxidized film 2a which is the lower layer thereof may be further removed.

In this way, the forming of the second movable semiconductor region S2a, the second fixed semiconductor region S2b, and the like in the formation portion of the second dynamic quantity sensor (acceleration sensor) R2 is finished, and the second movable electrode of the second movable semiconductor region S2a can be moved, whereby the second dynamic quantity detecting unit M2 is obtained. Moreover, the forming of the third movable semiconductor region S3a, the third fixed semiconductor region S3b, and the like in the formation portion of the third dynamic quantity sensor (angular velocity sensor) R3 is finished, and the third movable electrode of the third movable semiconductor region S3a can be moved, whereby the third dynamic quantity detecting unit M3 is obtained.

In this way, the first substrate 10 illustrated in FIG. 1A can be prepared.

The step of preparing the first substrate 10 includes the following steps particularly in order to form the wiring 4 in the embedded oxide film 2 and the first capacitance-type dynamic quantity detecting unit M1 of the first dynamic quantity sensor (pressure sensor) R1. That is, the step of preparing the first substrate 10 includes a first SOI substrate preparing step of depositing the first polycrystal silicon layer 3a on the oxide film formed on the supporting substrate 1 to use the oxide film as the embedded oxide film 2 and use the first polycrystal silicon layer 3a as a part of the SOI layer, a second SOI substrate preparing step of forming the auxiliary trench Ta in the first polycrystal silicon layer 3a so as to reach the embedded oxide film 2, depositing the second polycrystal silicon layer 3b on the first polycrystal silicon layer 3a to close an opening portion of the auxiliary trench Ta to obtain the hollow portion Ha, and using the stacked structure of the first polycrystal silicon layer 3a and the second polycrystal silicon layer 3b as the SOI layer 3, and a third SOI substrate preparing step of forming the trenches T to form the first semiconductor region S1a including the first wall portion Wa and the second semiconductor region S1b including the second wall portion Wb.

Figure 6:
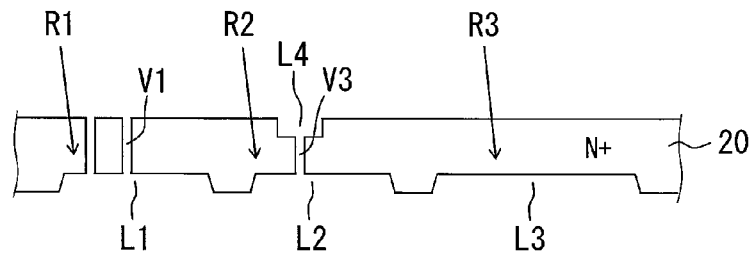
FIG. 6 is a cross-sectional view illustrating each step of an example of a method of manufacturing the dynamic quantity sensor device, and is a diagram illustrating a step of preparing a second substrate illustrated in FIG. 1A.

FIG. 6 is a diagram illustrating a step of preparing the second substrate 20 illustrated in FIG. 1A. In the step of preparing the second substrate 20, the second substrate 20 is prepared so that when bonding to the principal surface side of the first substrate 10, the first space K1, the second space K2, and the third space K3 in which the first dynamic quantity detecting unit M1, the second dynamic quantity detecting unit M2, and the third dynamic quantity detecting unit M3 are respectively airtightly accommodated in a displaceable state, are formed so as not to communicate with each other.

Therefore, an N+type single-crystal silicon substrate having a thickness of 100 to 400 μm, for example, and the (100) surface is used as the second substrate 20, and concave portions L1 to L4, and the first through hole V1 and the third through hole V3 illustrated in FIG. 1A are formed as illustrated in FIG. 6.

Figure 7A:
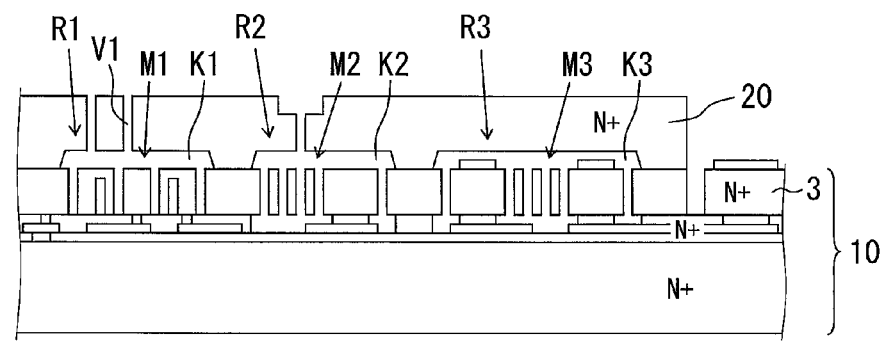

FIG. 7A is a diagram illustrating a substrate bonding step of bonding the second substrate 20 prepared in the step of FIG. 6 on the principal surface side of the first substrate 10 prepared in the steps of FIGS. 4A to 4E and FIGS. 5A to 5C.

In the substrate bonding step illustrated in FIG. 7A, a method of directly bonding silicon at room temperature in vacuum after activating the bonding surfaces with Ar ions and a bonding method using eutectic solder or low-melting point glass can be used, for example. By the bonding of the first substrate 10 and the second substrate 20, the first space K1, the second space K2, and the third space K3 in which the first dynamic quantity detecting unit M1 of the first dynamic quantity sensor R1, the second dynamic quantity detecting unit M2 of the second dynamic quantity sensor R2, and the third dynamic quantity detecting unit M3 of the third dynamic quantity sensor R3 are respectively airtightly accommodated, are formed so as not to communicate with each other. Moreover, by the bonding of the first substrate 10 and the second substrate 20 in vacuum, the third space K3 of the third dynamic quantity sensor (angular velocity sensor) R3 is sealed in vacuum.

Figure 7B:
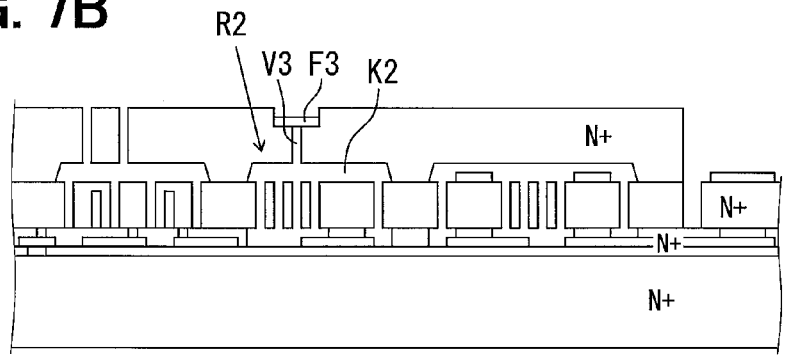

FIG. 7B is a diagram illustrating a step of sealing the second space K2 of the second dynamic quantity sensor (acceleration sensor) R2, which is performed after the first substrate 10 and the second substrate 20 are bonded.

In the step of sealing the second space K2 illustrated in FIG. 7B, a sealing member F3 is disposed above the third through hole V3 by an ink jet method, a screen printing method, and the like in a nitrogen ($N_2$) atmosphere of 1 atmospheric pressure, for example. In this way, the second space K2 of the second dynamic quantity sensor (acceleration sensor) R2 is sealed in a nitrogen ($N_2$) atmosphere of 1 atmospheric pressure.

By the steps illustrated in FIGS. 7A and 7B, since the third dynamic quantity sensor (angular velocity sensor) R3 is accommodated in the third vacuum space K3, the movable electrode becomes easy to move, and it is possible to detect angular velocity with high sensitivity and high accuracy. On the other hand, since the second dynamic quantity sensor (acceleration sensor) R2 is accommodated in the second space K2 in the nitrogen (N$_2$) atmosphere of 1 atmospheric pressure, it is possible to measure acceleration stably by a damping effect. Moreover, in the first dynamic quantity sensor (pressure sensor) R1, the first space K1 becomes a pressure chamber of the medium to be measured, and the first through hole V1 which is not sealed becomes a pressure introducing hole of the medium to be measured.

By the steps illustrated in FIGS. 4A to 7B, it is possible to manufacture the dynamic quantity sensor device 100 illustrated in FIGS. 1A and 1B. In this example, although an N+type silicon substrate and an N+type polycrystal silicon layer have been used, a P+type silicon substrate and a P+type polycrystal silicon layer containing P-type impurities of high concentration such as boron may be used.

Like the dynamic quantity sensor device 100 illustrated in FIGS. 1A and 1B, in a dynamic quantity sensor device in which the first dynamic quantity detecting unit M1 of the first dynamic quantity sensor R1, the second dynamic quantity detecting unit M2 of the second dynamic quantity sensor R2, and the third dynamic quantity detecting unit M3 of the third dynamic quantity sensor R3 are respectively airtightly accommodated in the first space K1, the second space K2, and the third space K3, the configuration of the wiring connected to the first dynamic quantity detecting unit M1, the second dynamic quantity detecting unit M2, and the third dynamic quantity detecting unit M3 is important.

Next, a dynamic quantity sensor device having a different wiring configuration, which is a modification example of the dynamic quantity sensor device 100 illustrated in FIGS. 1A and 1B, will be described.

Figure 8:
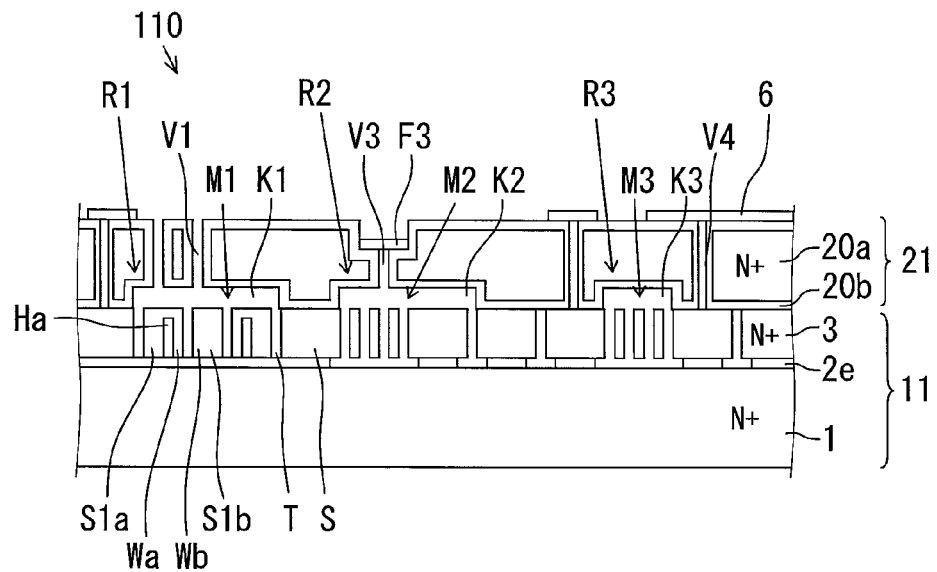
FIG. 8 is a diagram illustrating the cross-section of a main part of a dynamic quantity sensor device which is a modification example of the dynamic quantity sensor device illustrated in FIGS. 1A and 1B.

FIG. 8 is a diagram illustrating the cross-section of a main part of a dynamic quantity sensor device 110 which is a modification example of the dynamic quantity sensor device 100 illustrated in FIGS. 1A and 1B. In the dynamic quantity sensor device 110 illustrated in FIG. 8, the same portions as those of the dynamic quantity sensor device 100 illustrated in FIGS. 1A and 1B will be denoted by the same reference numerals.

The dynamic quantity sensor device 110 illustrated in FIG. 8 is a dynamic quantity sensor device in which a first dynamic quantity sensor (pressure sensor) R1 that detects pressure as a first dynamic quantity, a second dynamic quantity sensor (acceleration sensor) R2 that detects acceleration as a second dynamic quantity, and a third dynamic quantity sensor (angular velocity sensor) R3 that detects angular velocity as a third dynamic quantity are integrated, similarly to the dynamic quantity sensor device 100 illustrated in FIGS. 1A and 1B.

On the other hand, in the dynamic quantity sensor device 100 illustrated in FIGS. 1A and 1B, the wiring 4 connected to the first dynamic quantity detecting unit M1 of the first dynamic quantity sensor R1, the second dynamic quantity detecting unit M2 of the second dynamic quantity sensor R2, and the third dynamic quantity detecting unit M3 of the third dynamic quantity sensor R3 is formed in the embedded oxide film 2 of the first substrate 10. In contrast, the dynamic quantity sensor device 110 illustrated in FIG. 8 employs a configuration in which a wiring 6 connected to the first dynamic quantity detecting unit M1, the second dynamic quantity detecting unit M2, and the third dynamic quantity detecting unit M3 is formed so as to penetrate through a second substrate 21.

More specifically, in a dynamic quantity sensor device 110 of FIG. 8, a first substrate 11 is an SOI substrate including an embedded oxide film 2e having a single-layer structure and is not an SOI substrate in which the wiring 4 is formed in the embedded oxide film 2 like the first substrate 10 illustrated in FIGS. 1A and 1B. On the other hand, in the dynamic quantity sensor device 110 of FIG. 8, the second substrate 21 bonded to the first substrate 11 includes a wiring through hole V4 for wiring in addition to the through holes V1 and V3 illustrated in FIG. 1A, which is formed at a predetermined position of the single-crystal silicon substrate 20a. Moreover, the surface of the single-crystal silicon substrate 20a in which the through holes V1, V3, and V4 are formed is covered by an oxide film 20b. Moreover, a conductive material of the wiring 6 is formed on the outer surface of the second substrate 21 as a pattern so as to bury the wiring through hole V4.

In the dynamic quantity sensor device 110 in which the wiring, 6 is formed in the second substrate 21, a wiring layer and a pad portion for realizing electrical connection to the outside are formed on the upper surface of the second substrate 21, and a region for realizing electrical connection to the outside which is located on the right side of the figure, of the dynamic quantity sensor device 100 of FIGS. 1A and 1B becomes unnecessary. Thus, the dynamic quantity sensor device 110 of FIG. 8 can be reduced in size as compared to the dynamic quantity sensor device 100 of FIGS. 1A and 1B.

Next, a method of manufacturing the dynamic quantity sensor device 110 illustrated in FIG. 8 will be described.

FIGS. 9 to 12B are cross-sectional views of each step of an example of a method of manufacturing the dynamic quantity sensor device 110 illustrated in FIG. 8.

Figure 9:
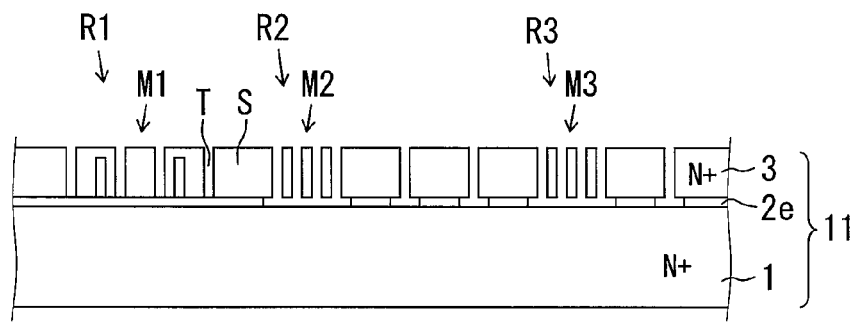
FIG. 9 is a cross-sectional view illustrating each step of an example of a method of manufacturing the dynamic quantity sensor device, and is a diagram illustrating a first substrate of the dynamic quantity sensor device before bonding.

FIG. 9 is a diagram illustrating the first substrate 11 of the dynamic quantity sensor device 110 illustrated in FIG. 8 before bonding. In the above-described example, a layer formed of polycrystal silicon is formed on the oxide film 2 as the SOI layer 3 of the first substrate 10. In contrast, in the first substrate 11 illustrated in FIG. 9, a layer formed of single-crystal silicon is formed on the oxide film 2e as the SOI layer 3. That is, in the first substrate 11, after forming the oxide film 2e on the supporting substrate 1 formed of single-crystal silicon, an N+type single-crystal silicon substrate is bonded to the first substrate 11, the N+type single-crystal silicon substrate is ground and polished from a side opposite to the bonding surface to form the SOI layer 3 formed of single-crystal silicon having a predetermined thickness. After that, the first substrate 11 can be prepared by the same step as the step of preparing the first substrate 10 described in FIGS. 4C to 4E and FIGS. 5B and 5C. In this case, in order to close the upper portion of the auxiliary trench Ta, the N+type single-crystal silicon layer was formed by epitaxial growth. By doing so, the airtight sealing, the strength, and the like are further improved.

Figure 10A:
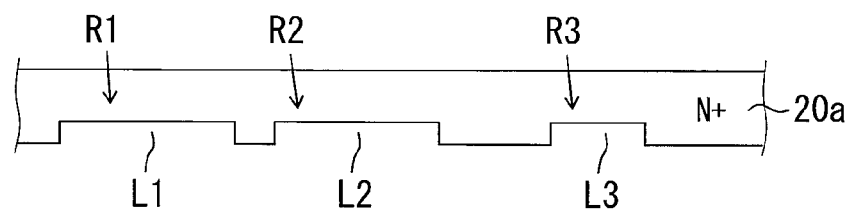
Figure 10B:
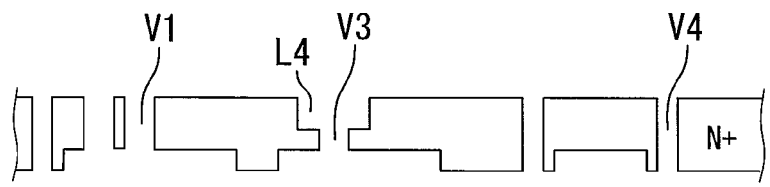
Figure 10C:
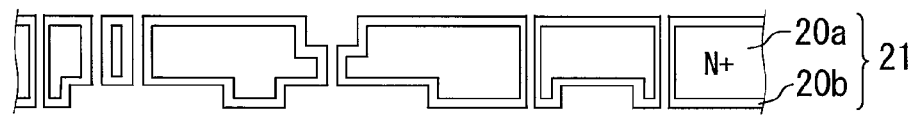

FIGS. 10A to 10C are diagrams illustrating a step of preparing the second substrate 21 of the dynamic quantity sensor device 110 illustrated in FIG. 8 before bonding.

First, as illustrated in FIG. 10A, an N+type single-crystal silicon substrate 20a having a thickness of 100 to 400 for example, and the (100) surface is prepared, and concave portions L1 to L3 are formed at predetermined positions on the bonding surface side bonded to the first substrate 11 by dry etching or wet etching, for example.

Subsequently, as illustrated in FIG. 10B, after forming a concave portion L4 at a predetermined position on the side opposite to the bonding surface, the through holes V1, V3, and V4 illustrated in FIG. 8 are formed by dry etching or using a laser beam.

Subsequently, as illustrated in FIG. 10C, an oxide film 20b is formed by a thermal oxidation method, a CVD method, or the like so that the entire surface of the single-crystal silicon substrate 20a is covered by the oxide film 20b.

In this way, the second substrate 21 before bonding illustrated in FIG. 8 can be prepared.

FIGS. 11A to 11C and FIGS. 12A and 12B are diagrams illustrating a step of bonding the first substrate 11 and the second substrate 21 prepared in FIG. 9 and FIGS. 10A to 10C, a step of forming the wiring 6 after bonding the substrates illustrated in FIG. 8, and a step of sealing the second space K2 of the second dynamic quantity sensor (acceleration sensor) R2, respectively.

Figure 11A:
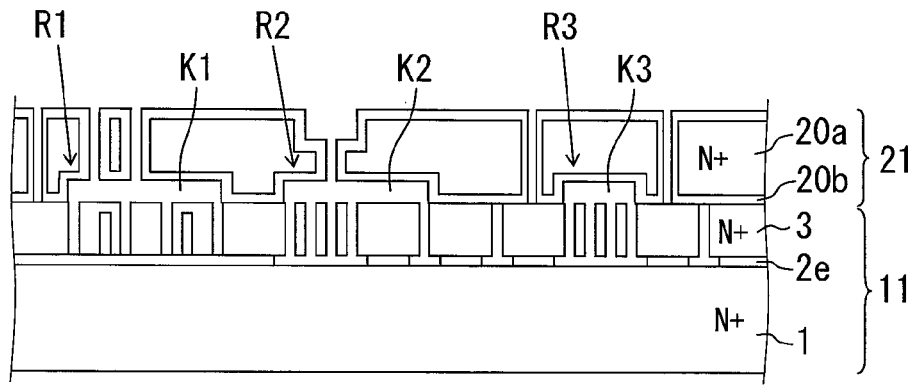

First, as illustrated in FIG. 11A, after activating the bonding surface with Ar ions or the like, the first substrate 11 and the second substrate 21 are bonded in vacuum using so-called room-temperature bonding. By the bonding of the first substrate 11 and the second substrate 21, the first space K1 of the first dynamic quantity sensor R1, the second space K2 of the second dynamic quantity sensor R2, and the third space K3 of the third dynamic quantity sensor R3 are formed so as not to communicate with each other. Moreover, by the bonding of the first substrate 11 and the second substrate 21 in vacuum, the third space K3 of the third dynamic quantity sensor (angular velocity sensor) R3 is sealed in vacuum.

Figure 11B:
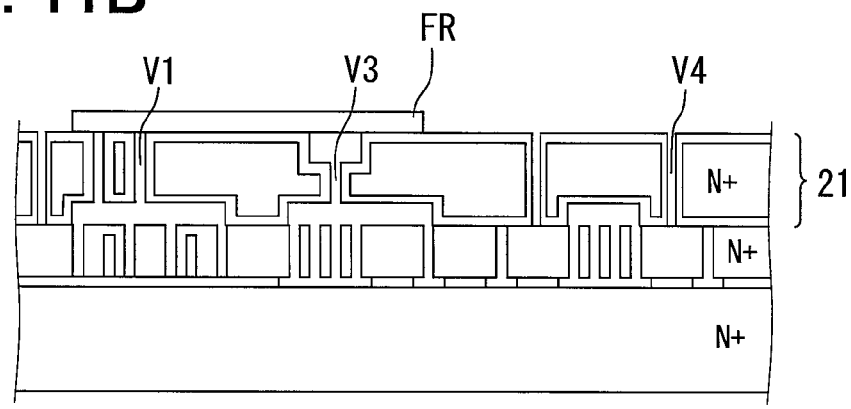

Subsequently, as illustrated in FIG. 11B, a film resist FR is attached to the upper surface of the second substrate 21 and is processed into a predetermined pattern that covers the first through hole V1 and the third through hole V3 excluding the wiring through hole V4.

Figure 11C:
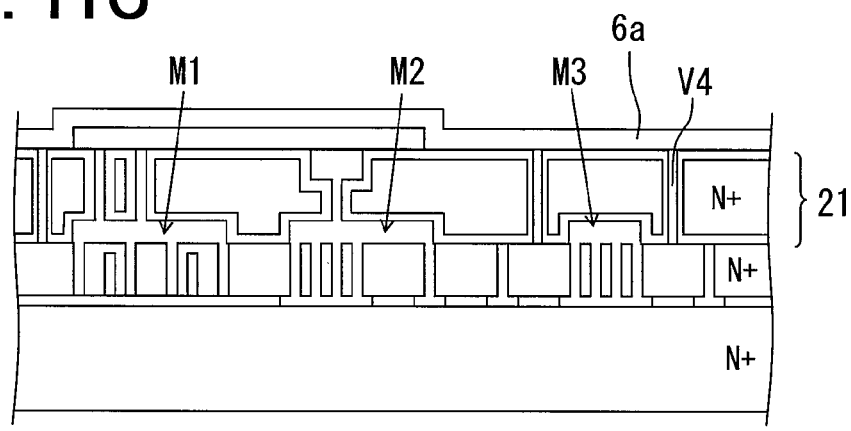

Subsequently, as illustrated in FIG. 11C, a conductive material 6a such as aluminum (Al) is deposited to the entire surface so as to bury the wiring through hole V4 by a deposition method, a sputtering method, or the like. In this way, the conductive material 6a is connected to predetermined positions of the first dynamic quantity detecting unit M1 of the first dynamic quantity sensor R1, the second dynamic quantity detecting unit M2 of the second dynamic quantity sensor R2, and the third dynamic quantity detecting unit M3 of the third dynamic quantity sensor R3 via the wiring through hole V4.

Figure 12A:
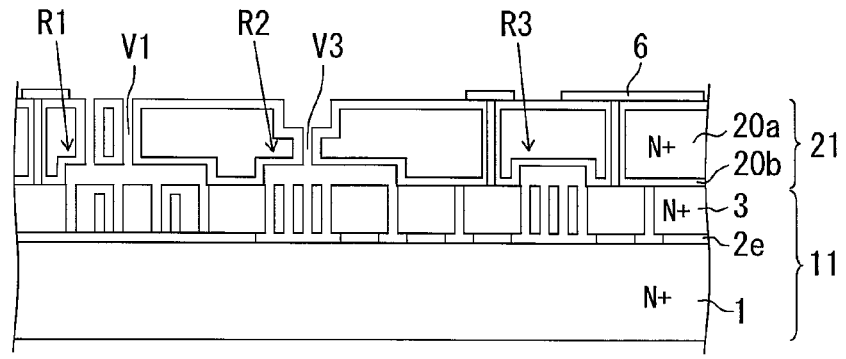

Subsequently, as illustrated in FIG. 12A, after the conductive material 6a is patterned to obtain the wiring 6 of FIG. 8, the film resist FR is removed. By this step, the first through hole (pressure introducing hole) V1 of the first dynamic quantity sensor (pressure sensor) R1 and the third through hole V3 of the second dynamic quantity sensor (acceleration sensor) R2 are exposed to the outside atmosphere.

Figure 12B:
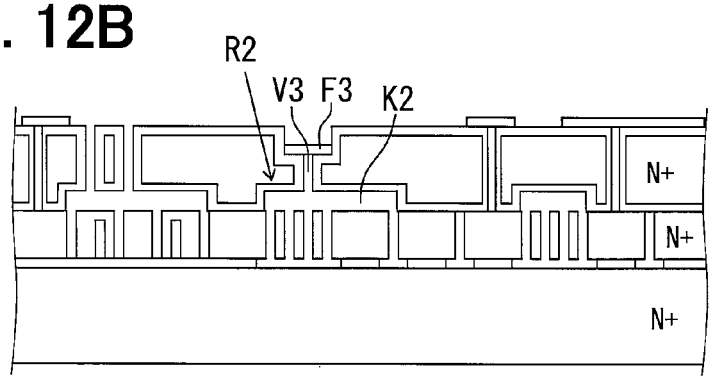

Subsequently, as illustrated in FIG. 12B, a sealing member F3 is disposed on the upper portion of the third through hole V3 by an ink jet method, a screen printing method, or the like in a nitrogen ($N_2$) atmosphere of 1 atmospheric pressure. In this way, the second space K2 of the second dynamic quantity sensor (acceleration sensor) R2 is sealed in a nitrogen ($N_2$) atmosphere of 1 atmospheric pressure.

By the steps illustrated in FIG. 9 to FIG. 12B, it is possible to manufacture the dynamic quantity sensor device 110 illustrated in FIG. 8.

In the method of manufacturing the dynamic quantity sensor device 110 illustrated in FIG. 9 to FIG. 12B, the step of preparing the second substrate 21 illustrated in FIGS. 10A to 10C includes a wiring through hole forming step of forming the wiring through hole V4 that penetrates through the second substrate 21. Moreover, as illustrated in FIGS. 11A to 11C and FIGS. 12A and 12B, the preparing step includes a second substrate penetrating wiring forming step of burying the wiring through hole V4 with the conductive material 6a to obtain the wiring 6 connected to the first dynamic quantity detecting unit M1 of the first dynamic quantity sensor R1, the second dynamic quantity detecting unit M2 of the second dynamic quantity sensor R2, and the third dynamic quantity detecting unit M3 of the third dynamic quantity sensor R3 after the substrate bonding step of FIG. 11A.

Figure 13:
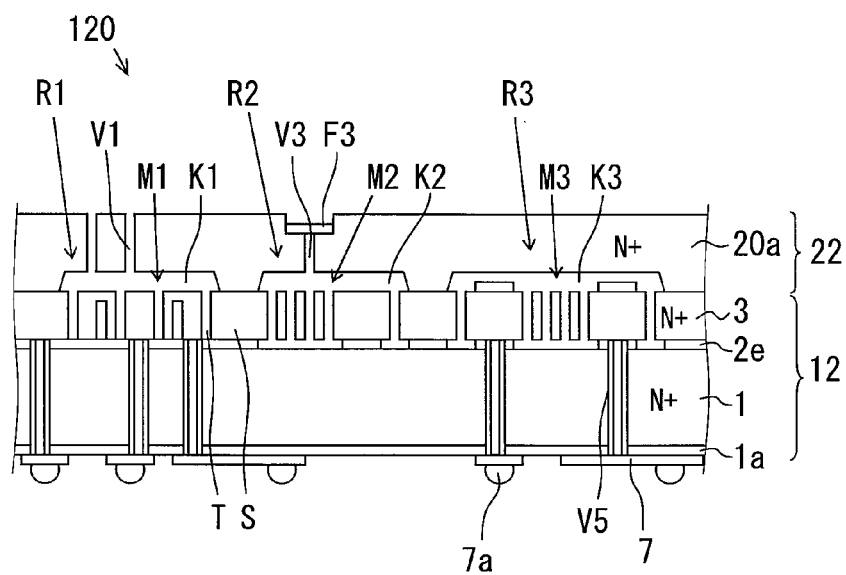
FIG. 13 is a diagram illustrating the cross-section of a main part of a dynamic quantity sensor device which is a modification example of the dynamic quantity sensor device illustrated in FIG. 8.

FIG. 13 is a diagram illustrating the cross-section of a main part of a dynamic quantity sensor device 120 which is a modification example of the dynamic quantity sensor device 110 illustrated in FIG. 8. In the dynamic quantity sensor device 120 illustrated in FIG. 13, the same portions as those of the dynamic quantity sensor device 110 illustrated in FIG. 8 will be denoted by the same reference numerals.

The dynamic quantity sensor device 120 illustrated in FIG. 13 is also a dynamic quantity sensor device in which a first dynamic quantity sensor (pressure sensor) R1 that detects pressure as a first dynamic quantity, a second dynamic quantity sensor (acceleration sensor) R2 that detects acceleration as a second dynamic quantity, and a third dynamic quantity sensor (angular velocity sensor) R3 that detects angular velocity as a third dynamic quantity are integrated, similarly to the dynamic quantity sensor device 110 illustrated in FIG. 8.

On the other hand, in the dynamic quantity sensor device 110 illustrated in FIG. 8, the wiring 6 connected to the first dynamic quantity detecting unit M1, the second dynamic quantity detecting unit M2, and the third dynamic quantity detecting unit M3 is formed so as to penetrate through the second substrate 21. In contrast, the dynamic quantity sensor device 120 illustrated in FIG. 13 employs a configuration in which a wiring 7 connected to the first dynamic quantity detecting unit M1, the second dynamic quantity detecting unit M2, and the third dynamic quantity detecting unit M3 is formed so as to penetrate through the supporting substrate 1 of the first substrate 12 and the embedded oxide film 2e.

More specifically, in the dynamic quantity sensor device 120 of FIG. 13, the first dynamic quantity detecting unit M1 of the first dynamic quantity sensor R1, the second dynamic quantity detecting unit M2 of the second dynamic quantity sensor R2, and the third dynamic quantity detecting unit M3 of the third dynamic quantity sensor R3 are formed in the SOI layer 3 on the embedded oxide film 2e of the first substrate 12 similarly to the dynamic quantity sensor device 110 of FIG. 8. On the other hand, in the first substrate 12 of the dynamic quantity sensor device 120 of FIG. 13, a wiring through hole V5 is formed so as to penetrate through the supporting substrate 1 and the embedded oxide film 2e unlike the dynamic quantity sensor device 110 of FIG. 8. Moreover, the side walls of the wiring through hole V5 and the surface of the supporting substrate 1 opposite to the embedded oxide film 2e are covered by the oxide film 1a, and a conductive material of the wiring 7 is patterned and formed on the outer surface of the first substrate 12 so as to bury the wiring through hole V5.

On the other hand, since the wiring 6 as in the second substrate 21 of the dynamic quantity sensor device 110 of FIG. 8 is not formed on the second substrate 22 bonded to the first substrate 12 of the dynamic quantity sensor device 120 of FIG. 13, the second substrate 22 is formed of only the single-crystal silicon substrate 20a without the oxide film 20b.

In the dynamic quantity sensor device 120 in which the wiring 7 is formed on the first substrate 12 of FIG. 13, a wiring layer and a pad portion for realizing electrical connection to the outside are formed on the lower surface of the supporting substrate 1 which is a constituent component of the first substrate 12. Therefore, for example, as illustrated in FIG. 13, by forming a bonding ball 7a on the wiring 7 and mounting the dynamic quantity sensor device on a wiring layer of a ceramic substrate or a printed substrate (not illustrated) by flip-chip bonding, it is possible to realize an electrical connection. Moreover, by connecting the dynamic quantity sensor device 120 to another integrated circuit IC chip, power may be supplied to or signals may be input and output to and from the respective dynamic quantity sensors R1 to R3. In the dynamic quantity sensor device 120 of FIG. 13, it is naturally possible to realize a reduction in size as compared to the dynamic quantity sensor device 100 of FIGS. 1A and 1B similarly to the dynamic quantity sensor device 110 of FIG. 8.

In manufacturing the dynamic quantity sensor device 120 illustrated in FIG. 13, for example, the step of forming the wiring 6 of the second substrate 21 used in the manufacturing of the dynamic quantity sensor device 110 of FIG. 8 can be applied to the forming of the wiring 7 of the first substrate 12 of FIG. 13. That is, the step of forming the through hole V4 in the single-crystal, silicon substrate 20a described in FIG. 10B and the step of forming the wiring 6 described in FIG. 10C, FIGS. 11A to 11C, and FIG. 12A are applied to the forming of the wiring through hole V5, the oxide film 1a, and the wiring 7 in the first substrate 12. The forming of the wiring 7 in the first substrate 12 may be formed in advance before forming the first dynamic quantity detecting unit M1, the second dynamic quantity detecting unit M2, and the third dynamic quantity detecting unit M3 on the SOI layer 3, for example, and may be formed after bonding the second substrate 22 to the first substrate 12.

Next, a dynamic quantity sensor device including a first dynamic quantity sensor (pressure sensor) having a different structure, which is a modification example of the dynamic quantity sensor device 100 illustrated in FIGS. 1A and 1B will be described.

For example, in the first dynamic quantity sensor (pressure sensor) Ra of the dynamic quantity sensor device 100 illustrated in FIGS. 1A and 1B, the first wall portion Wa is formed in a direction orthogonal to the embedded oxide film 2. In this way, it is possible to secure the easiness and high accuracy of processing trenches when forming the auxiliary trench Ta illustrated in FIG. 4D and the trenches T illustrated in FIG. 5B. However, the present disclosure is not limited to this, and when it is desired to increase the area of the first wall portion Wa functioning as the diaphragm without changing the thickness of the SOI layer 3, the first wall portion Wa may be formed in a direction obliquely crossing the embedded oxide film 2.

Figure 14A:
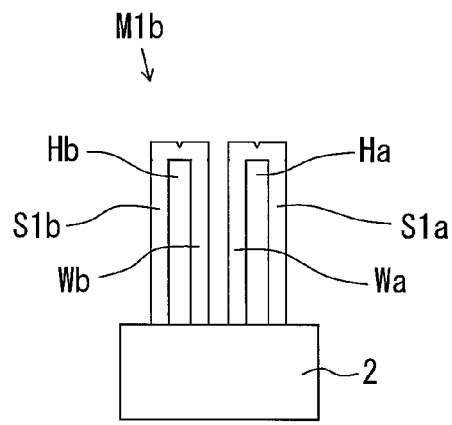
Figure 14B:
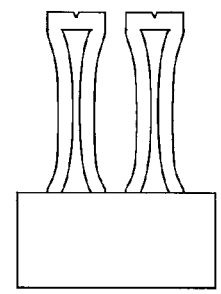

FIGS. 14A and 14B are cross-sectional views illustrating another configuration example of the first dynamic quantity detecting unit M1 of the first dynamic quantity sensor (pressure sensor) R1 illustrated in FIGS. 1A and 1B and FIGS. 2A and 2B, in which FIG. 14A is a diagram illustrating the state of a medium to be measured before pressure is applied, and FIG. 14B is a diagram illustrating the state after pressure is applied.

In the structure illustrated in FIGS. 14A and 14B, a vacuum hollow portion Ha and a vacuum hollow portion Hb are formed in the first semiconductor region S1a and the second semiconductor region S1b having the first wall portion Wa and the second wall portion Wb which face each other. Therefore, any of the first wall portion Wa and the second wall portion Wb can be deformed and displaced with the pressure of the medium to be measured and both function as a diaphragm. Therefore, the structure illustrated in FIGS. 14A and 14B can further increase the sensitivity since a change of capacitance with respect to the pressure of the medium to be measured is increased as compared to the structure illustrated in FIG. 2B.

Figure 15:
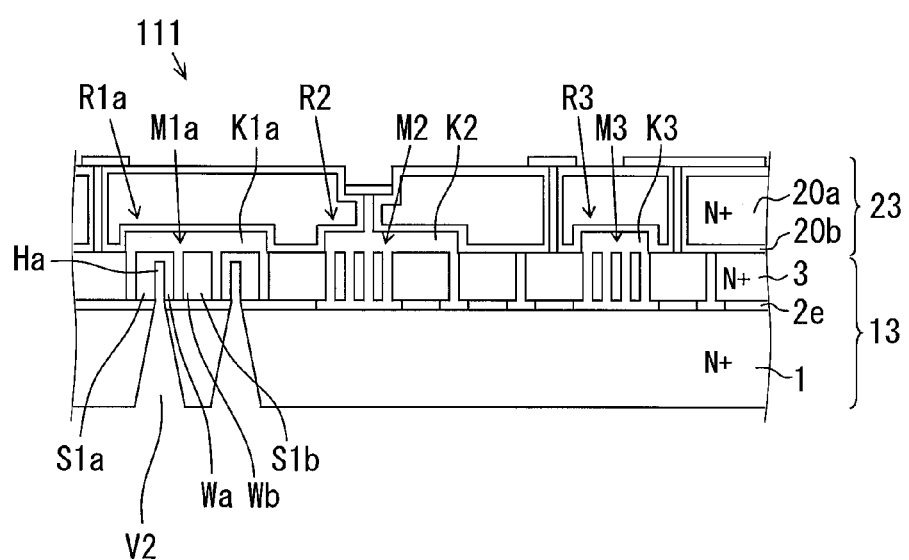
FIG. 15 is a diagram illustrating the cross-section of a main part of a dynamic quantity sensor device including a first dynamic quantity sensor (pressure sensor) having a different structure, which is another modification example of the dynamic quantity sensor device illustrated in FIG. 8.

FIG. 15 is a diagram illustrating the cross-section of a main part of a dynamic quantity sensor device 111 including a first dynamic quantity sensor (pressure sensor) R1a having a different structure, which is another modification example of the dynamic quantity sensor device 110 illustrated in FIG. 8. In the dynamic quantity sensor device 111 illustrated in FIG. 15, the same portions as those of the dynamic quantity sensor device 110 illustrated in FIG. 8 will be denoted by the same reference numerals.

In the first dynamic quantity sensor (pressure sensor) R1 of the dynamic quantity sensor devices 100 and 110 illustrated in FIGS. 1A and 1B and FIG. 8, the hollow portion Ha of the first semiconductor region S1a is sealed and set at a predetermined reference pressure (for example, vacuum), and the first through hole V1 is formed so as to penetrate through the second substrate 20 so that the outside of the second substrate 20 communicates with the first space K1. Moreover, at least the first electrode (the first wall portion Wa) is deformed and displaced in a direction vertical to the second electrode (the second wall portion Wb) in response to the pressure of the medium to be measured introduced to the first space K1 via the first through hole V1, and a change of capacitance due to a change of the space between the first electrode and the second electrode is measured to thereby detect pressure.

On the other hand, in the first dynamic quantity sensor (pressure sensor) R1a of the dynamic quantity sensor device 111 illustrated in FIG. 15, by the bonding of a first substrate 13 and a second substrate 23, a first space K1a is sealed and set at a predetermined reference pressure (for example, vacuum), and a second through hole V2 is formed so as to penetrate through the supporting substrate 1 and the embedded oxide film 2e of the first substrate 13 so that the outside of the first substrate 13 communicates with the hollow portion Ha of the first semiconductor region S1a. Moreover, the first electrode (the first wall portion Wa) of a first dynamic quantity detecting unit M1a is deformed and displaced in a direction vertical to the opposing surface of the second electrode (the second wall portion Wb) in response to the pressure of the medium to be measured introduced to the hollow portion Ha via the second through hole V2, and a change of capacitance due to a change of the space between the first electrode and the second electrode is measured to thereby detect pressure.

In the dynamic quantity sensor device 111 illustrated in FIG. 15, by the bonding of the first substrate 13 and the second substrate 23, it is possible to form a third vacuum space K3 of the third dynamic quantity sensor (angular velocity sensor) R3 and the first vacuum space K1a of the first dynamic quantity sensor (pressure sensor) R1a. When forming the second through hole V2 so as to penetrate through the supporting substrate 1 and the embedded oxide film 2e of the first substrate 13, the supporting substrate 1 formed of silicon, for example, is etched by alkali etching (for example, KOH aqueous solution) from the rear surface thereof so as to reach the embedded oxide film 2e formed of a silicon oxide ($SiO_2$), and subsequently, a hole is formed in the embedded oxide film 2e by dry etching or the like so as to communicate with the hollow portion Ha of the first semiconductor region S1a.

In the dynamic quantity sensor devices 100, 110, and 111 described above, any of the first dynamic quantity sensors (pressure sensors) R1 and R1a which are integrally formed into one SOI substrate together with another capacitance-type and high-accuracy dynamic quantity sensor (acceleration sensor or the like) is a capacitance-type pressure sensor. However, the pressure sensor which can be integrally formed into one SOI substrate together with another capacitance-type and high-accuracy dynamic quantity sensor is not limited to this. For example, when such high sensitivity is not required, and accuracy in the depth direction can be secured in processing trenches, the pressure sensor of the related art may be used in which a piezoelectric resistor element detects a diaphragm formed in parallel to the embedded oxide film of the SOI substrate and the deformation of the diaphragm illustrated in FIG. 20.

Next, another structure that seals the second space of the second dynamic quantity sensor (acceleration sensor) and a preferred example, which is a modification example of the dynamic quantity sensor device 100 illustrated in FIGS. 1A and 1B will be described.

In the dynamic quantity sensor device 100 illustrated in FIGS. 1A and 1B, the second dynamic quantity sensor R2 is an acceleration sensor, and the third through hole V3 is formed so as to penetrate through the second substrate 20 so that the outside of the second substrate 20 communicates with the second space K2. Moreover, the sealing member F3 that seals the third through hole V3 is disposed in the concave portion L4 on the outer surface of the second substrate 20 opposite to the bonding surface bonded to the first substrate 10. Furthermore, the maximum height of the sealing member F3 from the bonding surface is set to be lower than the maximum height of the outer surface of the second substrate 20 from the bonding surface.

In the second dynamic quantity sensor R2 which is an acceleration sensor, as described above, it is preferable that the second space K2 is sealed in a predetermined atmosphere in order to prevent stiction and suppress unnecessary high-frequency vibration. As a method of sealing the second space K2 in a predetermined atmosphere, a method of bonding the first substrate 10 and the second substrate 20 in a nitrogen ($N_2$) atmosphere of 1 atmospheric pressure can be considered, for example. However, it is difficult to employ this method when the third dynamic quantity sensor (angular velocity sensor) R3 in which the third vacuum space K3 is preferred is simultaneously integrated as in the dynamic quantity sensor device 100 illustrated in FIGS. 1A and 1B. Thus, the above-described method of forming the third through hole V3 so that the outside of the second substrate 20 communicates with the second space K2 and disposing the sealing member F3 that seals the third through hole V3 on the outer surface opposite to the bonding surface bonded to the first substrate 10 is simplest and can be applied to a combination with an optional dynamic quantity sensor device.

Although the sealing member F3 may be formed of any one of metal, polycrystal silicon, an insulating film, and the like, it is preferable that the maximum height of the sealing member F3 from the bonding surface is set to be lower than the maximum height of the outer surface of the second substrate 20 as described above, and the sealing member F3 does not protrude from the uppermost surface of the second substrate 20.

In an acceleration sensor, airtight sealing in a predetermined atmospheric pressure is an important point in maintaining performance. Thus, the sealing member F3 is configured so as not to protrude from the uppermost surface of the second substrate 20 to make the sealing member F3 difficult to make contact with a jig or other components during the manufacturing and to prevent the airtight sealing from being damaged by the occurrence of cracks or voids in the sealing member F3.

Like the dynamic quantity sensor device 100 illustrated in FIGS. 1A and 1B, in a chip-size package in which the first substrate 10 and the second substrate 20 are bonded to form the first space K1, the second space K2, and the third space K3, damage to airtight sealing is not so much of a problem when handling in a wafer state. However, the state after the bonded wafer is cut and divided to obtain chips is important, and a special structure such that the airtightly sealed portion is not touched when travelling and handling chips is required.

In the dynamic quantity sensor device 100 of FIGS. 1A and 1B, the sealing member F3 is disposed on the entire bottom surface of the concave portion L4 so as not to protrude from the outer surface of the second substrate 20. The sealing member F4 may be disposed on a part of the bottom surface of the concave portion L4 as long as it covers the opening portion of the third through hole V3.

FIGS. 16A to 19B are diagrams illustrating examples of respective structures for sealing the second space when the second dynamic quantity sensor integrally formed into the SOI substrate together with the first dynamic quantity sensor (pressure sensor) is an acceleration sensor.

Figure 16A:
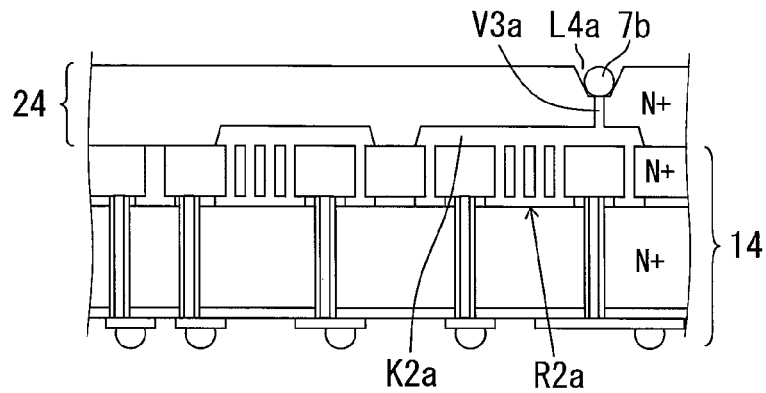
FIGS. 16A and 16B are cross-sectional views of a main part, illustrating each step of manufacturing a dynamic quantity sensor device having an acceleration sensor.
Figure 16B:
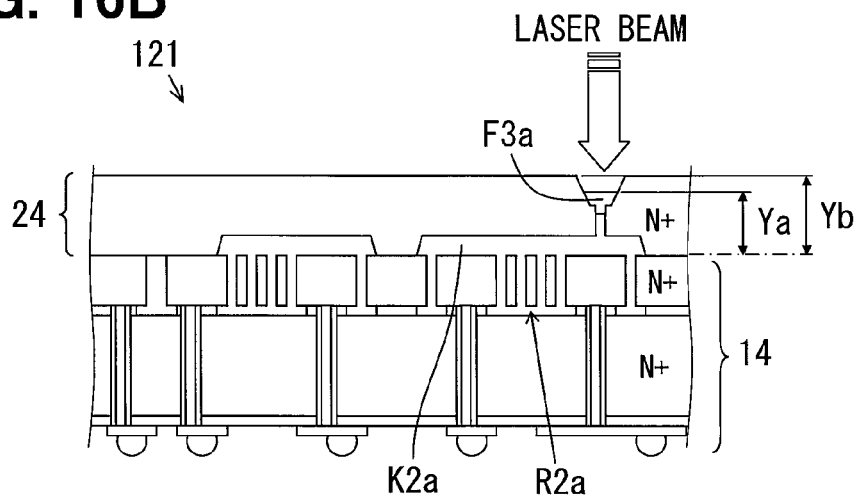

FIGS. 16A and 16B are cross-sectional views of a main part of each step of manufacturing a dynamic quantity sensor device 121 including an acceleration sensor R2a.

The dynamic quantity sensor device 121 illustrated in FIGS. 16a and 16B are formed by bonding a first substrate 14 and a second substrate 24, and includes the acceleration sensor R2a. A second space K2a of the acceleration sensor R2a is sealed in a predetermined atmospheric pressure by a sealing member F3a as illustrated in FIG. 16B. Moreover, a maximum height Ya of the sealing member F3a from a bonding surface indicated by a one-dot chain line in the figure is set to be lower than a maximum height Yb of the outer surface of the second substrate 24.

The sealing of the second space K2a is realized by disposing a gold ball 7b formed of gold (Au) or gold (Au) containing silicon (Si) in a concave portion L4a formed on the outer surface of the second substrate 24 as illustrated in FIG. 16A, irradiating the gold ball 7b with a laser beam in an atmosphere of a predetermined atmospheric pressure to thereby fuse the gold ball 7b so as to flow into a third through hole V3a as illustrated in FIG. 16B. In this case, Au—Si eutectic alloying occurs between the fused gold ball 7b and the second substrate 24 formed of single-crystal silicon. In this way, the sealing member F3a that seals the second space K2a in a predetermined atmospheric pressure is formed.

Figure 17:
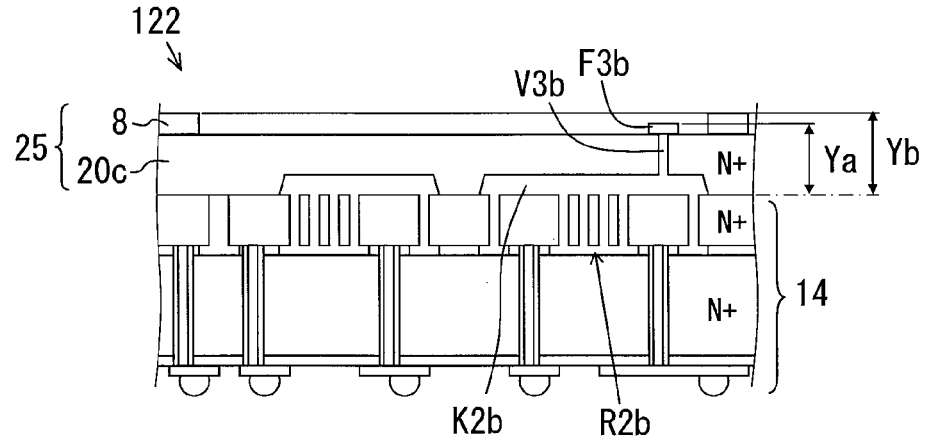
FIG. 17 is a cross-sectional view of a main part of a dynamic quantity sensor device having an acceleration sensor.

FIG. 17 is a cross-sectional view of a main part of a dynamic quantity sensor device 122 including an acceleration sensor R2b.

The dynamic quantity sensor device 122 illustrated in FIG. 17 is formed by bonding the first substrate 14 and a second substrate 25, and includes the acceleration sensor R2b. A second space K2b of the acceleration sensor R2b is sealed in a predetermined atmospheric pressure by a sealing member F3b that covers a third through hole V3b. Moreover, in the second substrate 25, a guard ring 8 formed of a resin is formed on the upper surface of a single-crystal silicon substrate 20c, and the maximum height Ya of the sealing member F3b from a bonding surface indicated by a one-dot chain line in the figure is set to be lower than the maximum height Yb of the outer surface of the second substrate 25. In forming the guard ring 8, attachment of a resin film in a wafer state, a dry film resist, resist dispense, ink jet, and the like can be used, for example.

Figure 18A:
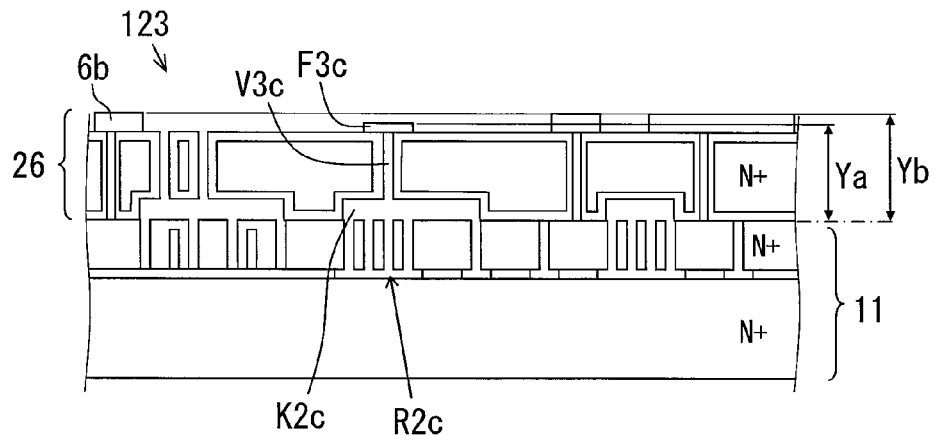
FIGS. 18A to 18C are cross-sectional views of a main part of dynamic quantity sensor devices having different acceleration sensors, respectively.
Figure 18B:
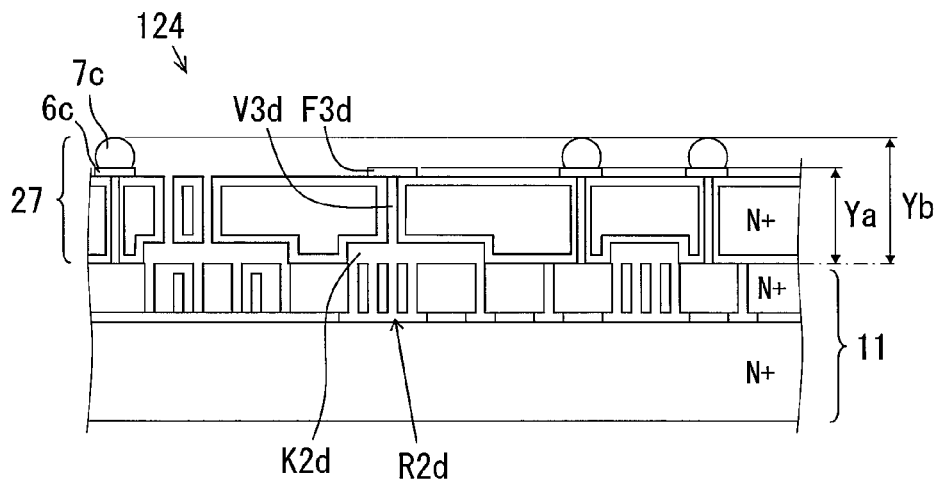
Figure 18C:
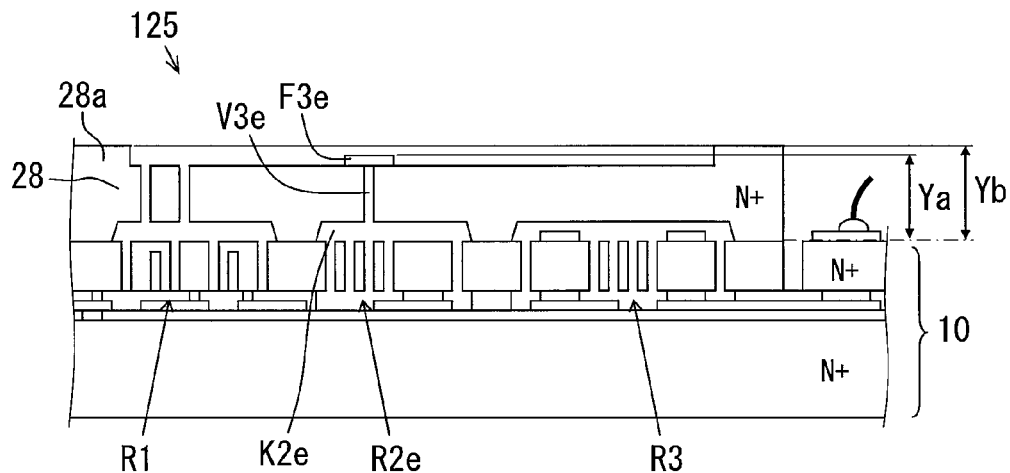

FIGS. 18A to 18C are cross-sectional views of a main part of dynamic quantity sensor devices 123 to 125 including other acceleration sensors R2c to R2e, respectively.

The dynamic quantity sensor device 123 illustrated in FIG. 18A is formed by bonding the first substrate 11 and a second substrate 26, and includes the acceleration sensor R2c. A second space K2c of the acceleration sensor R2c is sealed in a predetermined atmospheric pressure by a sealing member F3c that covers a third through hole V3c. Moreover, a thick wiring 6b is formed on the upper surface of the second substrate 26, and the maximum height Ya of the sealing member F3c is set to be lower than the maximum height Yb of the outer surface of the second substrate 26.

The dynamic quantity sensor device 124 illustrated in FIG. 18B is formed by bonding the first substrate 11 and a second substrate 27, and includes the acceleration sensor R2d. A second space K2d of the acceleration sensor R2d is sealed in a predetermined atmospheric pressure by a sealing member F3d that covers a third through hole V3d. Moreover, on the upper surface of the second substrate 27, a bonding ball 7c is formed on a wiring 6c, and the maximum height Ya of the sealing member F3d is set to be lower than the maximum height Yb of the outer surface of the second substrate 27.

The dynamic quantity sensor device 125 illustrated in FIG. 18C is formed by bonding the first substrate 10 and a second substrate 28, and includes the acceleration sensor R2e. A second space K2e of the acceleration sensor R2e is sealed in a predetermined atmospheric pressure by a sealing member F3e that covers a third through hole V3e. Moreover, a thick peripheral portion 28a is formed on the upper surface of the second substrate 28 so as to surround the pressure sensor R1, the acceleration sensor R2e, and the angular velocity sensor R3, and the maximum height Ya of the sealing member F3e is set to be lower than the maximum height Yb of the outer surface of the second substrate 28.

Figure 19A:
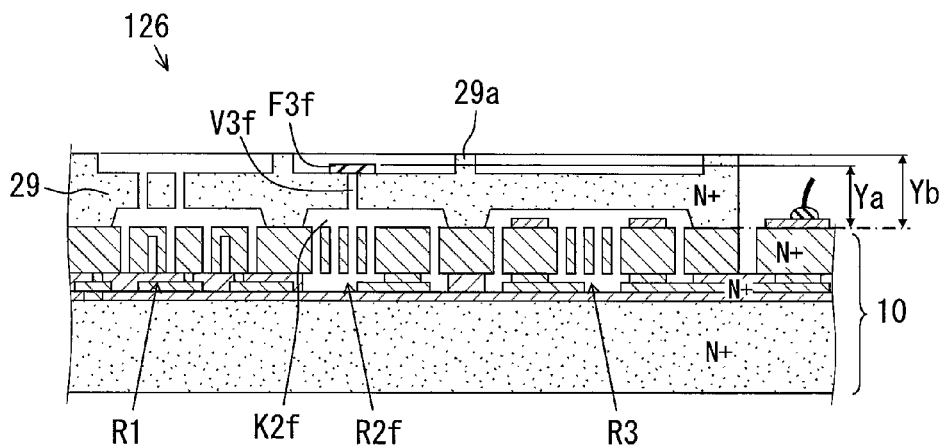
Figure 19B:
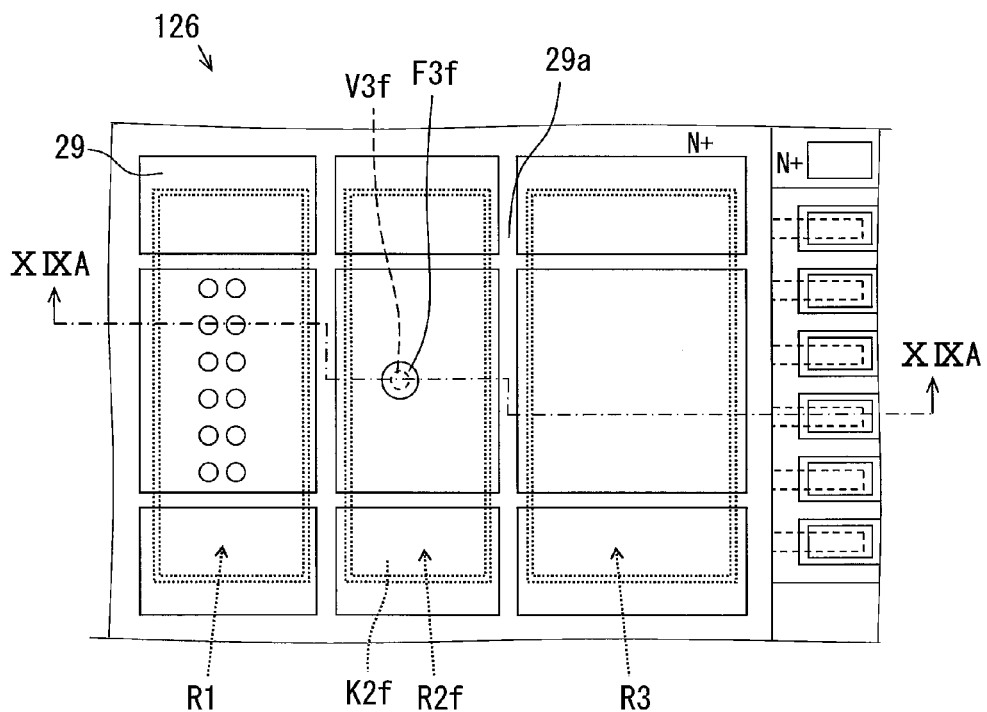

FIGS. 19A and 19B are diagrams illustrating a dynamic quantity sensor device 126 having a different acceleration sensor R2f, in which FIG. 19A is a diagram illustrating the cross-section of a main part of the dynamic quantity sensor device 126, and FIG. 19B is a top view of the dynamic quantity sensor device 126. FIG. 19A corresponds to the cross-section along the one-chain line IIIA-IIIA in FIG. 19B.

The dynamic quantity sensor, device 126 illustrated in FIGS. 19A and 19B is formed by bonding the first substrate 10 and a second substrate 29, and includes the acceleration sensor R2f. A second space K2f of the acceleration sensor R2f is sealed in a predetermined atmospheric pressure by a sealing member F3f that covers a third through hole V3f. Moreover, a frame-shaped rib portion 29a is formed on the upper surface of the second substrate 29 so as to surround the pressure sensor R1, the acceleration sensor R2f, and the angular velocity sensor R3. As illustrated in FIG. 19A, the maximum height Ya of the sealing member F3f is set to be lower than the maximum height Yb of the outer surface of the second substrate 29.

The dynamic quantity sensor devices 121 to 126 illustrated in FIGS. 16A to 19B have such a structure that the sealing members F3a to F3f are made difficult to make contact with a jig or other components during the manufacturing and damage to the second spaces K2a to K2f is prevented similarly to the dynamic quantity sensor device 100 of FIGS. 1A and 1B. Moreover, in the dynamic quantity sensor device 126 illustrated in FIGS. 19A and 19B, it is possible to prevent the sealing member F3f from protruding from the uppermost surface of the second substrate 29 and decrease the thickness of the second substrate 29 to the minimum necessary thickness to lighten the same, and the strength necessary for the second substrate 29 can be secured by the frame-shaped rib portion 29a. Moreover, in this example, the first substrate 10 and the second substrate 29 are bonded in vacuum, and subsequently, the through hole V3f on the upper portion of the acceleration sensor R2f is closed by the sealing member F3f in an $N_2$ (nitrogen) atmosphere of 1 atmospheric pressure. However, the present disclosure is not limited to this, and for example, a through hole may be formed in the upper portion of the angular velocity sensor (no through hole is formed in the upper portion of the acceleration sensor), and the first substrate and the second substrate may be bonded in an $N_2$ (nitrogen) atmosphere of 1 atmospheric pressure, and subsequently, the through hole on the upper portion of the angular velocity sensor may be closed by a sealing member in vacuum.

Any of the dynamic quantity sensor devices illustrated, above is a compact dynamic quantity sensor device in which three dynamic quantity sensors of the first dynamic quantity sensor (pressure sensor) and the capacitance-type and high-accuracy second dynamic quantity sensor (acceleration sensor) and the third dynamic quantity sensor (angular velocity sensor) are integrated into an SOI substrate as modules. However, the present disclosure is not limited to this, and the dynamic quantity sensor device of the present disclosure may be a dynamic quantity sensor device in which only two dynamic quantity sensors including a first dynamic quantity sensor for detecting pressure as a first dynamic quantity and a capacitance-type and high-accuracy second dynamic quantity sensor for detecting a second dynamic quantity other than pressure are integrated into the SOI substrate as modules. For example, a combination of a pressure sensor and an acceleration sensor, a combination of a pressure sensor and an angular velocity sensor (Coriolis force sensor), a combination of a pressure sensor and a Lorentz force sensor, and the like can be used. Moreover, for example, the capacitance-type and high-accuracy second dynamic quantity sensor and the third dynamic quantity sensor integrated with the first dynamic quantity sensor (pressure sensor) may be acceleration sensors for detecting acceleration in different in-plane directions. Alternatively, the second dynamic quantity sensor and the third dynamic quantity sensor may be angular velocity sensors for detecting angular velocity in different directions.

Furthermore, in the dynamic quantity sensor device of the present disclosure, a larger number of dynamic quantity sensors may be integrated into an SOI substrate as modules together with the first dynamic quantity sensor (pressure sensor) and the capacitance-type and high-accuracy second dynamic quantity sensor. For example, a combination of a pressure sensor, an acceleration sensor, an angular velocity sensor, and a Lorentz force sensor, and the like may be used. Furthermore, a plurality of pressure sensors including a pressure sensor for detecting absolute pressure and a pressure sensor for detecting relative pressure may be integrated as the first dynamic quantity sensor. Moreover, in order to manufacture pressure sensors having different sensitivity, a plurality of diaphragms having different thicknesses and sizes may be integrated. Moreover, an image sensor, an oscillator, an optical scanning mirror may be mounted as devices having, different airtight chambers together with the dynamic quantity sensor.

Since the dynamic quantity sensor device of the present disclosure can be formed as several hundreds of chips in a wafer state, and the plurality of different dynamic quantity sensors are mounted on one chip, it is possible to obtain inexpensive and compact devices having uniform characteristics.

In this way, the dynamic quantity sensor device can be configured as a compact dynamic quantity sensor device in which a pressure sensor (the first dynamic quantity sensor) and a capacitance-type and high-accuracy dynamic quantity sensor (the second dynamic quantity sensor) such as an acceleration sensor are integrated as modules, and can be configured as an inexpensive dynamic quantity sensor device in which the pressure sensor and other dynamic quantity sensors are optimally integrated as modules, and the performance of the respective dynamic quantity sensors is not degraded even when they are integrated as modules.

Figure 20:
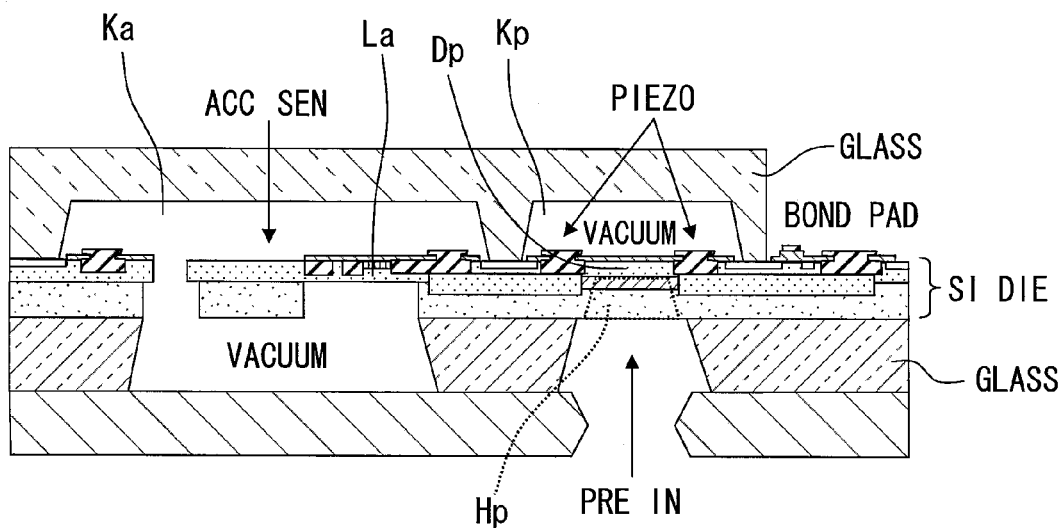
FIG. 20 is a diagram illustrating a cross-sectional structure of a sensor die, in which a pressure sensor and an acceleration sensor are integrated, according to the prior art.

Therefore, in the dynamic quantity sensor device, the function of a gyrosensor (angular velocity sensor) for detecting an advancing direction of a vehicle as well as the tire air pressure and a wheel rotation speed illustrated in FIG. 20, and the function of an acceleration sensor for detecting acceleration in the advancing direction can be incorporated with the pressure sensor of the first dynamic quantity sensor as the second dynamic quantity sensor. Moreover, the first dynamic quantity sensor of the dynamic quantity sensor device can be configured as a high-sensitivity pressure sensor for detecting a change of atmospheric pressure with a change of altitude of the vehicle position in accordance with travelling as well as a pressure sensor for detecting the tire air pressure. By appropriately combining the detecting functions of the first dynamic quantity sensor and the second dynamic quantity sensor, it is possible to obtain a compact and inexpensive dynamic quantity sensor device capable of controlling the travelling of a vehicle more stably.

Therefore, the dynamic quantity sensor device is very useful for in-vehicle installation.

The above disclosure has the following aspects.

According to a first aspect of the present disclosure, a dynamic quantity sensor device includes: a first dynamic quantity sensor for detecting pressure as a first dynamic quantity; a second dynamic quantity sensor for detecting a second dynamic quantity other than the pressure; a first substrate made of a SOI substrate having a support substrate, an embedded oxide film and a SOI layer, which are stacked in this order; and a second substrate. The first dynamic quantity sensor and the second dynamic quantity sensor are integrated with each other. The first dynamic quantity sensor includes a first dynamic quantity detecting unit, which is displaceable according to the pressure. The second dynamic quantity sensor includes a second dynamic quantity detecting unit, which is displaceable according to the second dynamic quantity. The first dynamic quantity detecting unit and the second dynamic quantity detecting unit are disposed on a principal surface of the first substrate. The first dynamic quantity detecting unit is spaced apart from the second dynamic quantity detecting unit by a predetermined distance. The second substrate is bonded to the principal surface of the first substrate so as to cover the first dynamic quantity detecting unit and the second dynamic quantity detecting unit. The first substrate and the second substrate provide a first space and a second space. The first dynamic quantity detecting unit is air-tightly accommodated in the first space, and the second dynamic quantity detecting unit is air-tightly accommodated in the second space. The first space and the second space do not communicate with each other. The SOI layer is divided into a plurality of semiconductor regions by a plurality of trenches so that the plurality of semiconductor regions are electrically isolated from each other. Each trench reaches the embedded oxide film. A first part of the plurality of semiconductor regions provides the first dynamic quantity detecting unit. A second part of the plurality of semiconductor regions provides the second dynamic quantity detecting unit. The second part of the plurality of semiconductor regions includes: a second movable semiconductor region having a second movable electrode, which is displaceable and is provided by etching a part of the embedded oxide film as a sacrificial layer; and a second fixed semiconductor region, having a second fixed electrode, which faces the second movable electrode. The second movable electrode and the second fixed electrode provide a capacitor having a dielectric layer, which is provided by space between the second movable electrode and the second fixed electrode. The second dynamic quantity sensor detects the second dynamic quantity by measuring a capacitance of the capacitor, which is changeable in accordance with displacement of the second movable electrode when the second movable electrode is displaced in response to the second dynamic quantity applied to the second dynamic quantity sensor.

As above, the dynamic quantity sensor device described above is a compact dynamic quantity sensor device in which the first dynamic quantity sensor (pressure sensor) for detecting pressure and the second dynamic quantity sensor for detecting the second dynamic quantity other than pressure such as acceleration or angular velocity are integrated as a module.

In the dynamic quantity sensor device described above, an SOI substrate including a supporting substrate, an SOI layer, and an embedded oxide film interposed therebetween is used as the first substrate for forming the first dynamic quantity sensor and the second dynamic quantity sensor. The first dynamic quantity detecting unit of the first dynamic quantity sensor and the second dynamic quantity detecting unit of the second dynamic quantity sensor are formed in the plurality of semiconductor regions formed of the SOI layer, isolated from the surroundings by the trenches that reach the embedded oxide film. Thus, the first dynamic quantity detecting unit and the second dynamic quantity detecting unit can be formed simultaneously by sharing the step of forming the trenches, and the manufacturing cost can be decreased.

Moreover, the second dynamic quantity sensor of the dynamic quantity sensor device is configured to measure a change of capacitance between the second movable electrode and the second fixed electrode formed to be displaceable to thereby detect the second dynamic quantity. The second dynamic quantity sensor can be more accurate than an acceleration sensor that detects a deformation of a cantilever using a piezoelectric resistor element or the like, for example, and may be a high-accuracy acceleration sensor or a high-accuracy angular velocity sensor (gyrosensor).

Furthermore, the second substrate is bonded to the principal surface side of the first substrate in which the first dynamic quantity detecting unit and the second dynamic quantity detecting unit are formed, and the first dynamic quantity sensor and the second dynamic quantity sensor are airtightly accommodated in the first space and the second space, respectively, which do not communicate with each other. Thus, the first space in which the first dynamic quantity sensor is accommodated and the second space in which the second dynamic quantity sensor is accommodated can be controlled to be in different environmental conditions where the performance of the respective dynamic quantity sensors is optimized. For example, the pressure of the second space in which the second dynamic quantity sensor is accommodated can be set independently from the pressure of the medium to be measured and the reference pressure, of the first space, and it is possible to prevent degradation of performance due to interference of the respective dynamic quantity sensors.

In this way, the dynamic quantity sensor device described above can be configured as a compact dynamic quantity sensor device in which the pressure sensor (the first dynamic quantity sensor) and the dynamic quantity sensor (the second dynamic quantity sensor) such as an acceleration sensor are integrated as a module, and can be configured as an inexpensive dynamic quantity sensor device in which the pressure sensor and the high-accuracy second dynamic quantity sensor are optimally integrated as a module, and the performance of the respective dynamic quantity sensors is not degraded even when they are integrated as modules.

Alternatively, the first part of the plurality of semiconductor regions may include: a first semiconductor region having a first wall portion as a first electrode, which extends in a direction across a surface of the embedded oxide film and has a hollow portion so that the first wall portion is thin, and the first wall portion is deformable and displaceable as a diaphragm; and a second semiconductor region having a second wall portion as a second electrode, which faces the first wall portion. The first electrode and the second electrode provide a capacitor having a dielectric layer, which is provided by a space between the first electrode and the second electrode. At least the first electrode is deformable and displaceable in a direction perpendicular to a facing surface of the second electrode in response to the pressure of a measurement object medium. The first dynamic quantity sensor detects the pressure by measuring a capacitance of the capacitor, which is changeable in accordance with a distance between the first electrode and the second electrode.

In the above case, the first dynamic quantity sensor including the first dynamic quantity detecting unit having the above configuration is a capacitance-type pressure sensor that measures a deformational displacement of the first wall portion (diaphragm) by the pressure of the medium to be measured as a change of capacitance. The first electrode (the first wall portion) and the second electrode (the second wall portion) of the first dynamic quantity detecting unit having the above configuration are formed of the semiconductor regions (the SOI layer) of the same conductivity type, and a PN junction is not present. Therefore, since the unstable state of capacitance detection characteristics due to PN junction does not occur, it is possible to maintain very stable capacitance detection characteristics against disturbance such as a temperature or an external atmosphere.

Moreover, according to the first dynamic quantity sensor having the above configuration, it is possible to set the thickness of the first wall portion functioning as a diaphragm independently from the thickness of the SOI layer. Thus, it is possible to set the thickness of the SOI layer, for example, so as to be optimal for the second movable semiconductor region of the second dynamic quantity sensor. Moreover, it is possible to set the thickness of the first wall portion functioning as the diaphragm of the first dynamic quantity sensor so as to be optimal for detection of the pressure of the medium to be measured.

Furthermore, according to the first dynamic quantity sensor having the above configuration, it is possible to increase the sensitivity easily as compared to the pressure sensor of the related art in which a piezoelectric resistor element detects a diaphragm formed in parallel to the embedded oxide film of the SOI substrate and the deformation of the diaphragm. That is, in the structure of the pressure sensor of the related art, since the sensitivity is increased by thinning the diaphragm, it is generally necessary to form a deep concave portion on the supporting substrate side of the SOI substrate by anisotropic etching. However, since the anisotropic etching provides lower processing accuracy in the depth direction than the accuracy in the plane direction determined by a mask, the structure of the pressure sensor of the related art has a problem in that the depth of the concave portion differs in respective chips, and the thickness of the diaphragm becomes uneven. In contrast, according to the first dynamic quantity sensor having the above configuration, the trench is processed by the anisotropic etching so that the thickness of the SOI layer is maximized, and as illustrated by the manufacturing method described later, the thickness of the first wall portion functioning as the diaphragm can be secured with the accuracy in the in-plane direction determined by the mask.

Alternatively, the first wall portion may be perpendicular to the surface of the embedded oxide film. In this case, the easiness of processing trenches and high accuracy is secured.

Alternatively, the hollow portion may be sealed by the first wall portion and the embedded oxide film so that the hollow portion has a predetermined reference pressure. The second substrate further includes a first through hole, which penetrates through the second substrate so that an outside of the second substrate communicates with the first space. At least the first electrode is deformable and displaceable in the direction perpendicular to the facing surface of the second electrode in response to the pressure of the measurement object medium, which is introduced to the first space via the first through hole.

Alternatively, the first space may be sealed by the second substrate and the first substrate so that the first space has a predetermined reference pressure. The first substrate further includes a second through hole, which penetrates through the supporting substrate and the embedded oxide film so that an outside of the first substrate communicates with the hollow portion. At least the first electrode is deformable and displaceable in a direction perpendicular to the facing surface of the second electrode in response to the pressure of the measurement object medium introduced to the hollow portion via the second through hole. Thus, the dynamic quantity sensor device described above can be configured as a compact dynamic quantity sensor device in which the pressure sensor (the first dynamic quantity sensor) and a capacitance-type and high-accuracy dynamic quantity sensor (the second dynamic quantity sensor) such as an acceleration sensor are integrated as a module, and can be configured as an inexpensive dynamic quantity sensor device in which a high-accuracy pressure sensor without fluctuation and the second dynamic quantity sensor are optimally integrated as a module, and performance of the respective dynamic quantity sensors is not degraded even when they are integrated as modules.

Alternatively, the second dynamic quantity sensor may include at least one of an acceleration sensor, an angular velocity sensor, and a Lorentz force sensor. When the second dynamic quantity sensor is the acceleration sensor, the second space is sealed in a predetermined atmospheric pressure. When the second dynamic quantity sensor is the angular velocity sensor or the Lorentz force sensor, the second space is sealed in vacuum.

In the dynamic quantity sensor device described above, when the second dynamic quantity sensor is an acceleration sensor, the second space is preferably sealed in a predetermined atmospheric pressure such as a nitrogen ($N_2$) atmosphere of 1 atmospheric pressure, for example, in order to prevent stiction (phenomenon where a movable portion adheres to the surroundings due to surface tension or the like and becomes difficult to move) and to suppress unnecessary high-frequency vibration. Moreover, when the second dynamic quantity sensor is an angular velocity sensor (Coriolis force sensor), the second space is preferably sealed in vacuum in order to vibrate a vibrating body at a desired high frequency and a desired amplitude to detect a displacement of the vibrating body based on the Coriolis force. Similarly, even when the second dynamic quantity sensor is a Lorentz force sensor, the second space is preferably sealed in vacuum in order to vibrate a vibrating body at a desired high frequency and desired amplitude to detect a change of capacitance of the vibrating body based on the Lorentz force. When the second dynamic quantity sensor is a Lorentz force sensor, it is possible to detect the direction of a vehicle in relation to the direction of geomagnetism.

Alternatively, the dynamic quantity sensor device may further include: a third dynamic quantity sensor for detecting a third dynamic quantity. The first dynamic quantity sensor, the second dynamic quantity sensor and the third dynamic quantity sensor are integrated with each other. The third dynamic quantity sensor includes a third dynamic quantity detecting unit, which is displaceable according to the third dynamic quantity. The first dynamic quantity detecting unit, the second dynamic quantity detecting unit and the third dynamic quantity detecting unit are disposed on the principal surface of the first substrate. The third dynamic quantity detecting unit is spaced apart from the first dynamic quantity detecting unit and the second dynamic quantity detecting unit by a predetermined distance, respectively. The second substrate covers the third dynamic quantity detecting unit. The first substrate and the second substrate further provide a third space. The third dynamic quantity detecting unit is air-tightly accommodated in the third space. The first space, the second space and the third space do not communicate with each other. A third part of the plurality of semiconductor regions provides the third dynamic quantity detecting unit. The third part of the plurality of semiconductor regions includes: a third movable semiconductor region having a third movable electrode, which is displaceable and is provided by etching another part of the embedded oxide film as another sacrificial layer; and a third fixed semiconductor region having a third fixed electrode, which faces the third movable electrode. The third movable electrode and the third fixed electrode provide another capacitor having a dielectric layer, which is provided by space between the third movable electrode and the third fixed electrode. The third dynamic quantity sensor detects the third dynamic quantity by measuring a capacitance of the another capacitor, which is changeable in accordance with displacement of the third movable electrode when the third movable electrode is displaced in response to the third dynamic quantity applied to the third dynamic quantity sensor. Further, the second dynamic quantity sensor and the third dynamic quantity sensor may be a combination of any two of an acceleration sensor, an angular velocity sensor, and a Lorentz force sensor. When the second dynamic quantity sensor or the third dynamic quantity sensor is the acceleration sensor, a corresponding second space or a corresponding third space is sealed in a predetermined atmospheric pressure. When the second dynamic quantity sensor or the third dynamic quantity sensor is the angular velocity sensor or the Lorentz force sensor, the corresponding second space or the corresponding third space is sealed in vacuum.

Alternatively, the dynamic quantity sensor device may further include: a fourth dynamic quantity sensor for detecting a fourth dynamic quantity. The first dynamic quantity sensor, the second dynamic quantity sensor, the third dynamic quantity sensor and the fourth dynamic quantity sensor are integrated with each other. The fourth dynamic quantity sensor includes a fourth dynamic quantity detecting unit, which is displaceable according to the fourth dynamic quantity. The first dynamic quantity detecting unit, the second dynamic quantity detecting unit, the third dynamic quantity detecting unit and the fourth dynamic quantity detecting unit are disposed on the principal surface of the first substrate. The fourth dynamic quantity detecting unit is spaced apart from the first dynamic quantity detecting unit, the second dynamic quantity detecting unit and the third dynamic quantity detecting unit by a predetermined distance, respectively. The second substrate covers the fourth dynamic quantity detecting unit. The first substrate and the second substrate further provide a fourth space. The fourth dynamic quantity detecting unit is air-tightly accommodated in the fourth space. The first space, the second space, the third space and the fourth space do not communicate with each other. A fourth part of the plurality of semiconductor regions provides the fourth dynamic quantity detecting unit. The fourth part of the plurality of semiconductor regions includes: a fourth movable semiconductor region having a fourth movable electrode, which is displaceable and is provided by etching further another part of the embedded oxide film as further another sacrificial layer; and a fourth fixed semiconductor region having a fourth fixed electrode, which faces the fourth movable electrode. The fourth movable electrode and the fourth fixed electrode provide further another capacitor having a dielectric layer, which is provided by space between the fourth movable electrode and the fourth fixed electrode. The fourth dynamic quantity sensor detects the fourth dynamic quantity by measuring a capacitance of the further another capacitor, which is changeable in accordance with displacement of the fourth movable electrode when the fourth movable electrode is displaced in response to the fourth dynamic quantity applied to the fourth dynamic quantity sensor.

Further, the second dynamic quantity sensor, the third dynamic quantity sensor, and the fourth dynamic quantity sensor may be an acceleration sensor, an angular velocity sensor, and a Lorentz force sensor, respectively. The second space is sealed in a predetermined atmospheric pressure, and the third space and the fourth space are sealed in vacuum.

Thus, a larger number of dynamic quantity sensors may be integrated into the dynamic quantity sensor device together with the first dynamic quantity sensor for detecting pressure and the second dynamic quantity sensor for detecting the second dynamic quantity. Furthermore, a plurality of pressure sensors including a pressure sensor for detecting absolute pressure and a pressure sensor for detecting relative pressure may be integrated as the first dynamic quantity sensor. Moreover, in order to manufacture pressure sensors having different sensitivity, a plurality of diaphragms having different thicknesses and sizes may be integrated.

When the second dynamic quantity sensor of the dynamic quantity sensor device described above is an acceleration sensor, a third through hole is preferably formed so as to penetrate through the second substrate so that the outside of the second substrate communicates with the second space, and a sealing member that seals the third through hole is preferably disposed on the outer surface of the second substrate opposite to the bonding surface bonded to the first substrate. Moreover, the maximum height of the sealing member from the bonding surface may be set to be lower than the maximum height of the outer surface from the bonding surface.

When the second dynamic quantity sensor is an acceleration sensor, the second space is preferably sealed in a predetermined atmospheric pressure in order to prevent stiction and suppress unnecessary high-frequency vibration. As a method of sealing the second space in a predetermined atmospheric pressure, a method of bonding the first substrate and the second substrate in nitrogen ($N_2$) atmosphere of 1 atmospheric pressure, for example, can be considered. However, it is difficult to employ this method when an angular velocity sensor is also integrated as the third dynamic quantity sensor, for example. Thus, the above-described method of forming the third through hole so that the outside of the second substrate communicates with the second space and disposing the sealing member that seals the third through hole on the outer surface opposite to the bonding surface bonded to the first substrate is the simplest, and can be applied to a combination with an optional dynamic quantity sensor.

Alternatively, the second dynamic quantity sensor may be the acceleration sensor. The second substrate further includes: a third through hole, which penetrates through the second substrate so that an outside of the second substrate communicates with the second space; a sealing member that seals the third through hole, and is disposed on an outer surface of the second substrate opposite to a facing surface of the second substrate. A maximum height of the sealing member from the facing surface of the second substrate is lower than a maximum height of an outer surface of the second substrate. In this case, although the sealing member may be formed of any one of metal, polycrystal silicon, an insulating film, and the like, it is preferable that the maximum height of the sealing member from the bonding surface is set to be lower than the maximum height of the outer surface of the second substrate as described above, and the sealing member does not protrude from the uppermost surface of the second substrate.

In an acceleration sensor, airtight sealing in a predetermined atmospheric pressure is an important point in maintaining performance. Thus, the sealing member is configured so as not to protrude from the uppermost surface of the second substrate to make the sealing member difficult to come in contact with a jig or other components during the manufacturing and to prevent the airtight sealing from being damaged by the occurrence of cracks or voids in the sealing member.

In a chip-size package in which the first substrate and the second substrate are bonded to form the first space and the second space, damage to the airtight sealing is not so much of a problem when handling in a wafer state. However, the state after the bonded wafer is cut and divided to obtain chips is important, and a special structure such that the airtightly sealed portion is not touched when travelling and handling chips is required.

Alternatively, the second substrate may further include a frame-shaped rib portion, which is disposed on the outer surface of the second substrate. The maximum height of the outer surface is provided by an upper surface of the rib portion. With this, it is possible to prevent the sealing member from protruding from the uppermost surface of the second substrate and decrease the second substrate to the minimum necessary thickness to lighten the same, and the strength necessary for the second substrate can be secured by the frame-shaped rib portion.

Moreover, in the dynamic quantity sensor device in which the first dynamic quantity detecting unit and the second dynamic quantity detecting unit are airtightly accommodated in the first space and the second space, respectively, the configuration of the wiring connected to the first dynamic quantity detecting unit and the second dynamic quantity detecting unit is important.

Alternatively, the dynamic quantity sensor device may further include: a wiring for connecting to the first dynamic quantity detecting unit and the second dynamic quantity detecting unit. The wiring penetrates through the second substrate.

Alternatively, the dynamic quantity sensor device may further include: a wiring for connecting to the first dynamic quantity detecting unit and the second dynamic quantity detecting unit. The wiring penetrates through the supporting substrate and the embedded oxide film.

Alternatively, the dynamic quantity sensor device may further include: a wiring for connecting to the first dynamic quantity detecting unit and the second dynamic quantity detecting unit. The wiring is disposed in the embedded oxide film.

In this way, the dynamic quantity sensor device can be configured as a compact dynamic quantity sensor device in which a pressure sensor (the first dynamic quantity sensor) and a capacitance-type and high-accuracy dynamic quantity sensor (the second dynamic quantity sensor) such as an acceleration sensor are integrated as modules, and can be configured as an inexpensive dynamic quantity sensor device in which the pressure sensor and other dynamic quantity sensors are optimally integrated as modules, and the performance of the respective dynamic quantity sensors is not degraded even when they are integrated as a module.

Therefore, in the dynamic quantity sensor device, the function of a gyrosensor (angular velocity sensor) for detecting an advancing direction of a vehicle as well as the tire air pressure and a wheel rotation speed and the function of an acceleration sensor for detecting acceleration in the advancing direction can be incorporated with the pressure sensor of the first dynamic quantity sensor as the second dynamic quantity sensor. Moreover, the first dynamic quantity sensor of the dynamic quantity sensor device can be configured as a high-sensitivity pressure sensor for detecting a change of atmospheric pressure with a change of altitude of the vehicle position in accordance with travelling as well as a pressure sensor for detecting the tire air pressure. By appropriately combining the detecting functions of the first dynamic quantity sensor and the second dynamic quantity sensor, it is possible to obtain a compact and inexpensive dynamic quantity sensor device capable of controlling the travelling of a vehicle more stably.

Thus, the dynamic quantity sensor device may be mounted on a vehicle.

According to a second aspect of the present disclosure, a method of manufacturing the dynamic quantity sensor device according to the first aspect, includes: preparing the first substrate including: forming the trenches in the SOI layer of the SOI substrate so as to provide the plurality of semiconductor regions; and forming the first dynamic quantity detecting unit and the second dynamic quantity detecting unit; preparing the second substrate in such a manner that the first space and the second space are provided by the first substrate and the second substrate, and the first space and the second space do not communicate with each other when the second substrate is bonded to the principal surface of the first substrate; and bonding the second substrate to the principal surface of the first substrate.

In the above method, the dynamic quantity sensor device described above can be configured as a compact dynamic quantity sensor device in which the pressure sensor (the first dynamic quantity sensor) and the dynamic quantity sensor (the second dynamic quantity sensor) are integrated as a module, and can be configured as an inexpensive dynamic quantity sensor device in which the pressure sensor and the high-accuracy second dynamic quantity sensor are optimally integrated as a module, and the performance of the respective dynamic quantity sensors is not degraded even when they are integrated as modules.

Alternatively; the preparing of the second substrate may include: forming a wiring through hole so as to penetrate through the second substrate. The method of manufacturing the dynamic quantity sensor device may further include: burying the wiring through hole with a conductive material so that the wiring for connecting to the first dynamic quantity detecting unit and the second dynamic quantity detecting unit is formed. The burying of the wiring through hole is performed after the bonding of the second substrate.

Alternatively, the preparing of the first substrate may further include: forming the wiring at a predetermined position of the embedded oxide film before forming the SOI layer. The wiring connects to the first dynamic quantity detecting unit and the second dynamic quantity detecting unit.

According to a third aspect of the present disclosure, a method of manufacturing the dynamic quantity sensor device according to the first aspect, includes: preparing a first substrate including: forming the trenches in the SOI layer so as to provide the plurality of semiconductor regions; and forming the first dynamic quantity detecting unit and the second dynamic quantity detecting unit; preparing the second substrate in such a manner that the first space and the second space are provided by the first substrate and the second substrate, and the first space and the second space do not communicate with each other when the second substrate is bonded to the principal surface of the first substrate; and bonding the second substrate to the principal surface of the first substrate. The preparing of the first substrate further includes: depositing a first polycrystal silicon layer on an oxide film, which is formed on the supporting substrate so that the oxide film provides the embedded oxide film, and the first polycrystal silicon layer provides a part of the SOI layer; depositing a second polycrystal silicon layer on the first polycrystal silicon layer so that an opening of an auxiliary trench is closed in order to form the hollow portion, and a stacked structure of the first polycrystal silicon layer and the second polycrystal silicon layer provides the SOI layer after forming the auxiliary trench in the first polycrystal silicon layer so as to reach the embedded oxide film; and forming the trenches to provide the first semiconductor region having the first wall portion and the second semiconductor region having the second wall portion.

In the above method, the dynamic quantity sensor device described above can be configured as a compact dynamic quantity sensor device in which the pressure sensor (the first dynamic quantity sensor) and the dynamic quantity sensor (the second dynamic quantity sensor) are integrated as a module, and can be configured as an inexpensive dynamic quantity sensor device in which the pressure sensor and the high-accuracy second dynamic quantity sensor are optimally integrated as a module, and the performance of the respective dynamic quantity sensors is not degraded even when they are integrated as modules.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A dynamic quantity sensor device comprising:
   a first dynamic quantity sensor for detecting pressure as a first dynamic quantity;
   a second dynamic quantity sensor for detecting a second dynamic quantity other than the pressure;
   a first substrate made of a SOI substrate having a support substrate, an embedded oxide film and a SOI layer, which are stacked in this order; and
   a second substrate,
   wherein the first dynamic quantity sensor and the second dynamic quantity sensor are integrated with each other,
   wherein the first dynamic quantity sensor includes a first dynamic quantity detecting unit, which is displaceable according to the pressure,
   wherein the second dynamic quantity sensor includes a second dynamic quantity detecting unit, which is displaceable according to the second dynamic quantity,
   wherein the first dynamic quantity detecting unit and the second dynamic quantity detecting unit are disposed on a principal surface of the first substrate,
   wherein the first dynamic quantity detecting unit is spaced apart from the second dynamic quantity detecting unit by a predetermined distance,
   wherein the second substrate is bonded to the principal surface of the first substrate so as to cover the first dynamic quantity detecting unit and the second dynamic quantity detecting unit,
   wherein the first substrate and the second substrate provide a first space and a second space,
   wherein the first dynamic quantity detecting unit is air-tightly accommodated in the first space, and the second dynamic quantity detecting unit is air-tightly accommodated in the second space,
   wherein the first space and the second space do not communicate with each other,
   wherein the SOI layer is divided into a plurality of semiconductor regions by a plurality of trenches so that the plurality of semiconductor regions are electrically isolated from each other,
   wherein each trench reaches the embedded oxide film,
   wherein a first part of the plurality of semiconductor regions provides the first dynamic quantity detecting unit,
   wherein a second part of the plurality of semiconductor regions provides the second dynamic quantity detecting unit,
   wherein the second part of the plurality of semiconductor regions includes:
      a second movable semiconductor region having a second movable electrode, which is displaceable and is provided by etching a part of the embedded oxide film as a sacrificial layer; and
      a second fixed semiconductor region having a second fixed electrode, which faces the second movable electrode,
   wherein the second movable electrode and the second fixed electrode provide a capacitor having a dielectric layer, which is provided by space between the second movable electrode and the second fixed electrode, and
   wherein the second dynamic quantity sensor detects the second dynamic quantity by measuring a capacitance of the capacitor, which is changeable in accordance with displacement of the second movable electrode when the second movable electrode is displaced in response to the second dynamic quantity applied to the second dynamic quantity sensor.

2. The dynamic quantity sensor device according to claim 1,
   wherein the first part of the plurality of semiconductor regions includes:
      a first semiconductor region having a first wall portion as a first electrode, which extends in a direction across a surface of the embedded oxide film and has a hollow portion so that the first wall portion is thin, and the first wall portion is deformable and displaceable as a diaphragm; and
      a second semiconductor region having a second wall portion as a second electrode, which faces the first wall portion,
   wherein the first electrode and the second electrode provide a capacitor having a dielectric layer, which is provided by a space between the first electrode and the second electrode,
   wherein at least the first electrode is deformable and displaceable in a direction perpendicular to a facing surface of the second electrode in response to the pressure of a measurement object medium, and wherein the first dynamic quantity sensor detects the pressure by measuring a capacitance of the capacitor, which is changeable in accordance with a distance between the first electrode and the second electrode.

3. The dynamic quantity sensor device according to claim 2,
wherein the first wall portion is perpendicular to the surface of the embedded oxide film.

4. The dynamic quantity sensor device according to claim 2,
wherein the hollow portion is sealed by the first wall portion and the embedded oxide film so that the hollow portion has a predetermined reference pressure,
wherein the second substrate further includes a first through hole, which penetrates through the second substrate so that an outside of the second substrate communicates with the first space, and
wherein at least the first electrode is deformable and displaceable in the direction perpendicular to the facing surface of the second electrode in response to the pressure of the measurement object medium, which is introduced to the first space via the first through hole.

5. The dynamic quantity sensor device according to claim 2,
wherein the first space is sealed by the second substrate and the first substrate so that the first space has a predetermined reference pressure,
wherein the first substrate further includes a second through hole, which penetrates through the support substrate and the embedded oxide film so that an outside of the first substrate communicates with the hollow portion, and
wherein at least the first electrode is deformable and displaceable in a direction perpendicular to the facing surface of the second electrode in response to the pressure of the measurement object medium introduced to the hollow portion via the second through hole.

6. A method of manufacturing the dynamic quantity sensor device according to claim 2, comprising:
preparing a first substrate including: forming the trenches in the SOI layer so as to provide the plurality of semiconductor regions; and forming the first dynamic quantity detecting unit and the second dynamic quantity detecting unit;
preparing the second substrate in such a manner that the first space and the second space are provided by the first substrate and the second substrate, and the first space and the second space do not communicate with each other when the second substrate is bonded to the principal surface of the first substrate; and
bonding the second substrate to the principal surface of the first substrate,
wherein the preparing of the first substrate further includes:
depositing a first polycrystal silicon layer on an oxide film, which is formed on the support substrate so that the oxide film provides the embedded oxide film, and the first polycrystal silicon layer provides a part of the SOI layer;
depositing a second polycrystal silicon layer on the first polycrystal silicon layer so that an opening of an auxiliary trench is closed in order to form the hollow portion, and a stacked structure of the first polycrystal silicon layer and the second polycrystal silicon layer provides the SOI layer after forming the auxiliary trench in the first polycrystal silicon layer so as to reach the embedded oxide film; and
forming the trenches to provide the first semiconductor region having the first wall portion and the second semiconductor region having the second wall portion.

7. The dynamic quantity sensor device according to claim 1,
wherein the second dynamic quantity sensor includes at least one of an acceleration sensor, an angular velocity sensor, and a Lorentz force sensor,
wherein, when the second dynamic quantity sensor is the acceleration sensor, the second space is sealed in a predetermined atmospheric pressure, and
wherein, when the second dynamic quantity sensor is the angular velocity sensor or the Lorentz force sensor, the second space is sealed in vacuum.

8. The dynamic quantity sensor device according to claim 1, further comprising:
a third dynamic quantity sensor for detecting a third dynamic quantity,
wherein the first dynamic quantity sensor, the second dynamic quantity sensor and the third dynamic quantity sensor are integrated with each other,
wherein the third dynamic quantity sensor includes a third dynamic quantity detecting unit, which is displaceable according to the third dynamic quantity,
wherein the first dynamic quantity detecting unit, the second dynamic quantity detecting unit and the third dynamic quantity detecting unit are disposed on the principal surface of the first substrate,
wherein the third dynamic quantity detecting unit is spaced apart from the first dynamic quantity detecting unit and the second dynamic quantity detecting unit by a predetermined distance, respectively,
wherein the second substrate covers the third dynamic quantity detecting unit,
wherein the first substrate and the second substrate further provide a thirds space,
wherein the third dynamic quantity detecting unit is airtightly accommodated in the third space,
wherein the first space, the second space and the third space do not communicate with each other,
wherein a third part of the plurality of semiconductor regions provides the third dynamic quantity detecting unit,
wherein the third part of the plurality of semiconductor regions includes:
a third movable semiconductor region having a third movable electrode, which is displaceable and is provided by etching another part of the embedded oxide film as another sacrificial layer; and
a third fixed semiconductor region having a third fixed electrode, which faces the third movable electrode,
wherein the third movable electrode and the third fixed electrode provide another capacitor having a dielectric layer, which is provided by space between the third movable electrode and the third fixed electrode, and
wherein the third dynamic quantity sensor detects the third dynamic quantity by measuring a capacitance of the another capacitor, which is changeable in accordance with displacement of the third movable electrode when the third movable electrode is displaced in response to the third dynamic quantity applied to the third dynamic quantity sensor.

9. The dynamic quantity sensor device according to claim 8,
wherein the second dynamic quantity sensor and the third dynamic quantity sensor are a combination of any two of an acceleration sensor, an angular velocity sensor, and a Lorentz force sensor,
wherein, when the second dynamic quantity sensor or the third dynamic quantity sensor is the acceleration sensor, a corresponding second space or a corresponding third space is sealed in a predetermined atmospheric pressure, and
wherein, when the second dynamic quantity sensor or the third dynamic quantity sensor is the angular velocity sensor or the Lorentz force sensor, the corresponding second space or the corresponding third space is sealed in vacuum.

10. The dynamic quantity sensor device according to claim 8, further comprising:
a fourth dynamic quantity sensor for detecting a fourth dynamic quantity,
wherein the first dynamic quantity sensor, the second dynamic quantity sensor, the third dynamic quantity sensor and the fourth dynamic quantity sensor are integrated with each other,
wherein the fourth dynamic quantity sensor includes a fourth dynamic quantity detecting unit, which is displaceable according to the fourth dynamic quantity,
wherein the first dynamic quantity detecting unit, the second dynamic quantity detecting unit, the third dynamic quantity detecting unit and the fourth dynamic quantity detecting unit are disposed on the principal surface of the first substrate,
wherein the fourth dynamic quantity detecting unit is spaced apart from the first dynamic quantity detecting unit, the second dynamic quantity detecting unit and the third dynamic quantity detecting unit by a predetermined distance, respectively,
wherein the second substrate covers the fourth dynamic quantity detecting unit,
wherein the first substrate and the second substrate further provide a fourth space,
wherein the fourth dynamic quantity detecting unit is airtightly accommodated in the fourth space,
wherein the first space, the second space, the third space and the fourth space do not communicate with each other,
wherein a fourth part of the plurality of semiconductor regions provides the fourth dynamic quantity detecting unit,
wherein the fourth part of the plurality of semiconductor regions includes:
a fourth movable semiconductor region having a fourth movable electrode, which is displaceable and is provided by etching further another part of the embedded oxide film as further another sacrificial layer; and
a fourth fixed semiconductor region having a fourth fixed electrode, which faces the fourth movable electrode,
wherein the fourth movable electrode and the fourth fixed electrode provide further another capacitor having a dielectric layer, which is provided by space between the fourth movable electrode and the fourth fixed electrode, and
wherein the fourth dynamic quantity sensor detects the fourth dynamic quantity by measuring a capacitance of the further another capacitor, which is changeable in accordance with displacement of the fourth movable electrode when the fourth movable electrode is displaced in response to the fourth dynamic quantity applied to the fourth dynamic quantity sensor.

11. The dynamic quantity sensor device according to claim 10,
wherein the second dynamic quantity sensor, the third dynamic quantity sensor, and the fourth dynamic quantity sensor are an acceleration sensor, an angular velocity sensor, and a Lorentz force sensor, respectively, and
wherein the second space is sealed in a predetermined atmospheric pressure, and the third space and the fourth space are sealed in vacuum.

12. The dynamic quantity sensor device according to claim 7,
wherein the second dynamic quantity sensor is the acceleration sensor,
wherein the second substrate further includes:
a third through hole, which penetrates through the second substrate so that an outside of the second substrate communicates with the second space;
a sealing member that seals the third through hole, and is disposed on an outer surface of the second substrate opposite to a facing surface of the second substrate, and
wherein a maximum height of the sealing member from the facing surface of the second substrate is lower than a maximum height of an outer surface of the second substrate.

13. The dynamic quantity sensor device according to claim 12,
wherein the second substrate further includes a frame-shaped rib portion, which is disposed on the outer surface of the second substrate, and
wherein the maximum height of the outer surface is provided by an upper surface of the rib portion.

14. The dynamic quantity sensor device according to claim 1, further comprising:
a wiring for connecting to the first dynamic quantity detecting unit and the second dynamic quantity detecting unit,
wherein the wiring penetrates through the second substrate.

15. The dynamic quantity sensor device according to claim 1, further comprising:
a wiring for connecting to the first dynamic quantity detecting unit and the second dynamic quantity detecting unit,
wherein the wiring penetrates through the support substrate and the embedded oxide film.

16. The dynamic quantity sensor device according to claim 1, further comprising:
a wiring for connecting to the first dynamic quantity detecting unit and the second dynamic quantity detecting unit,
wherein the wiring is disposed in the embedded oxide film.

17. The dynamic quantity sensor device according to claim 1,
wherein the dynamic quantity sensor device is mounted on a vehicle.

18. A method of manufacturing the dynamic quantity sensor device according to claim 1, comprising:
preparing the first substrate including: forming the trenches in the SOI layer of the SOI substrate so as to provide the plurality of semiconductor regions; and forming the first dynamic quantity detecting unit and the second dynamic quantity detecting unit;
preparing the second substrate in such a manner that the first space and the second space are provided by the first substrate and the second substrate, and the first space and the second space do not communicate with each other when the second substrate is bonded to the principal surface of the first substrate; and bonding the second substrate to the principal surface of the first substrate.

19. The method of manufacturing the dynamic quantity sensor device according to claim 18, wherein the preparing of the second substrate includes:
  forming a wiring through hole so as to penetrate through the second substrate, the method of manufacturing the dynamic quantity sensor device further comprising:

burying the wiring through hole with a conductive material so that the wiring for connecting to the first dynamic quantity detecting unit and the second dynamic quantity detecting unit is formed, wherein the burying of the wiring through hole is performed after the bonding of the second substrate.

20. The method of manufacturing the dynamic quantity sensor device according to claim 18, wherein the preparing of the first substrate further includes:
  forming the wiring at a predetermined position of the embedded oxide film before forming the SOI layer, and wherein the wiring connects to the first dynamic quantity detecting unit and the second dynamic quantity detecting unit.

* * * * *